(12) United States Patent
Kim et al.

(10) Patent No.: US 11,367,620 B2
(45) Date of Patent: *Jun. 21, 2022

(54) METHOD OF FABRICATING SEMICONDUCTOR DEVICE

(71) Applicant: Samsung Electronics Co., Ltd., Suwon-si (KR)

(72) Inventors: Dong-Hyuk Kim, Seongnam (KR); Gi-Gwan Park, Suwon-si (KR); Tae-Young Kim, Hwaseong-si (KR); Dong-Suk Shin, Yongin-si (KR)

(73) Assignee: Samsung Electronics Co., Ltd.

( * ) Notice: Subject to any disclaimer, the term of this patent is extended or adjusted under 35 U.S.C. 154(b) by 21 days.

This patent is subject to a terminal disclaimer.

(21) Appl. No.: 17/037,811

(22) Filed: Sep. 30, 2020

(65) Prior Publication Data

US 2021/0013044 A1 Jan. 14, 2021

Related U.S. Application Data

(63) Continuation of application No. 15/287,268, filed on Oct. 6, 2016, now Pat. No. 10,796,919.

(30) Foreign Application Priority Data

Oct. 14, 2015 (KR) ........................ 10-2015-0143552

(51) Int. Cl.
*H01L 21/3065* (2006.01)
*H01L 29/66* (2006.01)
*H01L 29/78* (2006.01)
*H01L 21/311* (2006.01)
*H01L 21/02* (2006.01)
(Continued)

(52) U.S. Cl.
CPC .... *H01L 21/3065* (2013.01); *H01L 21/02057* (2013.01); *H01L 21/02658* (2013.01); *H01L 21/02661* (2013.01); *H01L 21/31116* (2013.01); *H01L 29/66545* (2013.01); *H01L 29/66795* (2013.01); *H01L 29/7848* (2013.01); *H01L 29/161* (2013.01); *H01L 29/165* (2013.01)

(58) Field of Classification Search
CPC ........... H01L 21/31116; H01L 29/7848; H01L 29/66545; H01L 21/0266; H01L 29/66795; H01L 21/3065; H01L 21/02658; H01L 21/02057; H01L 29/16; H01L 29/165
See application file for complete search history.

(56) References Cited

U.S. PATENT DOCUMENTS 5,487,483 A 1/1996 Kubby
7,667,227 B2 2/2010 Shimamune et al.
(Continued)

FOREIGN PATENT DOCUMENTS

JP 5119604 B2 1/2013
JP 5206427 B2 6/2013

*Primary Examiner* — Savitri Mulpuri
(74) *Attorney, Agent, or Firm* — Myers Bigel, P.A.

(57) ABSTRACT

Methods for fabricating semiconductor devices include forming a fin-type pattern protruding on a substrate, forming a gate electrode intersecting the fin-type pattern, forming a first recess adjacent to the gate electrode and within the fin-type pattern by using dry etching, forming a second recess by treating a surface of the first recess with a surface treatment process including a deposit process and an etch process, and forming an epitaxial pattern in the second recess.

10 Claims, 20 Drawing Sheets

(51) Int. Cl.
 *H01L 29/165* (2006.01)
 *H01L 29/161* (2006.01)

(56) References Cited

U.S. PATENT DOCUMENTS

| | | |
|---|---|---|
| 8,367,528 B2 | 2/2013 | Bauer et al. |
| 8,598,003 B2 | 12/2013 | Murtthy et al. |
| 8,853,039 B2 | 10/2014 | Tsai et al. |
| 8,900,942 B2 | 12/2014 | Kim et al. |
| 8,999,794 B2 | 4/2015 | Fang et al. |
| 9,012,310 B2 | 4/2015 | Tsai et al. |
| 9,263,342 B2 | 2/2016 | Lee et al. |
| 9,287,398 B2 | 3/2016 | Kwok et al. |
| 9,324,830 B2 | 4/2016 | He |
| 9,425,129 B1 | 8/2016 | Zang et al. |
| 9,496,385 B2 | 11/2016 | Tsai et al. |
| 9,502,298 B2 | 11/2016 | Tsai et al. |
| 9,502,404 B2 | 11/2016 | Tsai et al. |
| 9,893,183 B2 | 2/2018 | Kuang et al. |
| 9,911,829 B2 | 3/2018 | Yu et al. |
| 9,978,650 B2 | 5/2018 | Cheng et al. |
| 2011/0117732 A1 | 5/2011 | Bauer et al. |
| 2013/0040438 A1 | 2/2013 | Adam et al. |
| 2014/0170840 A1 | 6/2014 | Tsai et al. |
| 2014/0235038 A1 | 8/2014 | Liao et al. |
| 2015/0214223 A1 | 7/2015 | Tsai et al. |
| 2015/0318282 A1* | 11/2015 | Rodder ............... H01L 21/0257 438/275 |
| 2016/0086945 A1 | 3/2016 | Liu |

\* cited by examiner

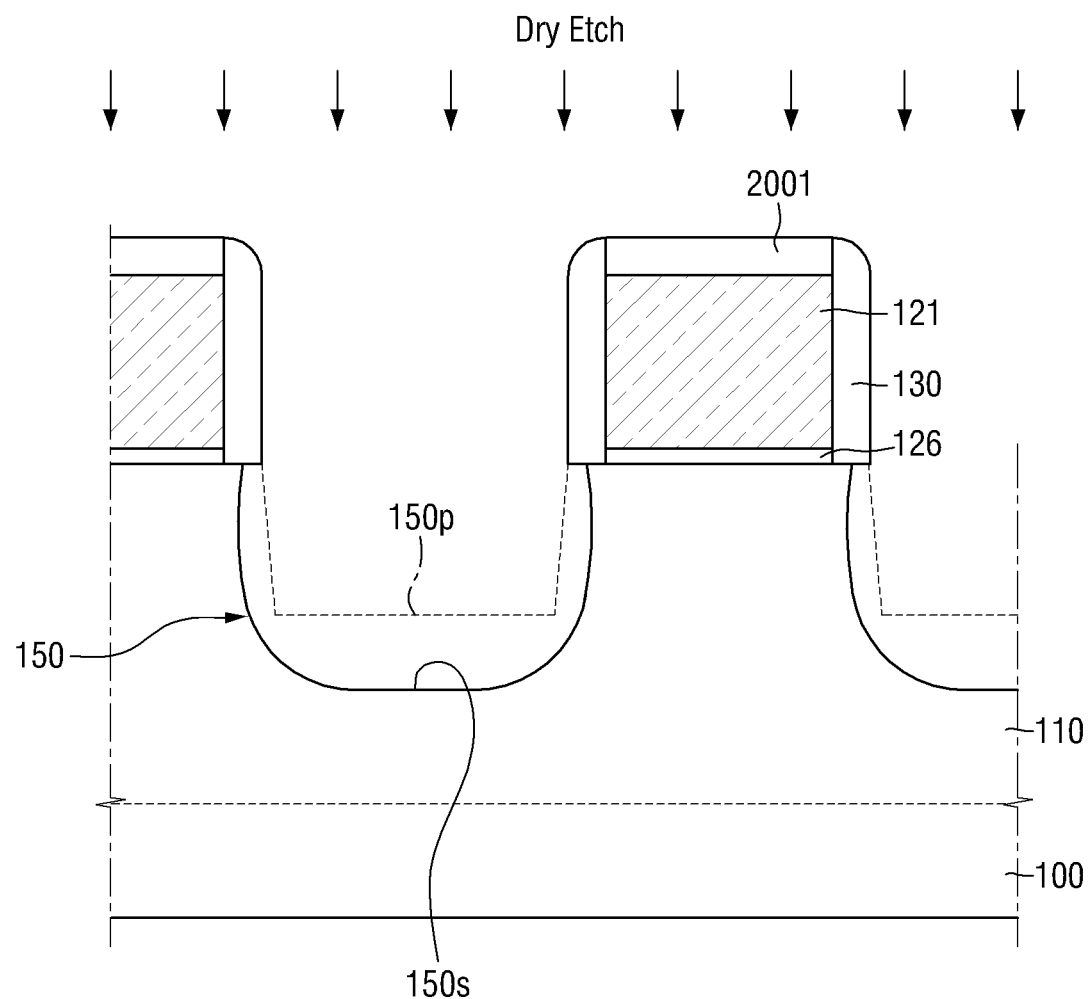

METHOD OF FABRICATING SEMICONDUCTOR DEVICE

CROSS-REFERENCE TO RELATED APPLICATION

This application is a continuation of U.S. patent application Ser. No. 15/287,268, filed Oct. 6, 2016, which claims priority from Korean Patent Application No. 10-2015-0143552 filed on Oct. 14, 2015 in the Korean Intellectual Property Office, and all the benefits accruing therefrom under 35 U.S.C. 119, the disclosure of which is incorporated by reference herein in its entirety.

BACKGROUND

1. Technical Field

The present inventive concepts relate to methods of fabricating semiconductor devices.

2. Description of Related Art

For semiconductor device density enhancement, a multi-gate transistor may be used as a scaling technology in which a multi-channel active pattern (or silicon body) in a fin or nanowire shape may be formed on a substrate, with gates being formed on a surface of the multi-channel active pattern.

Such multigate transistors may allow scaling as they may employ three-dimensional channel regions. Further, current control capability can be enhanced without requiring increased gate length in multigate transistors. In addition, it may be possible to suppress short channel effect (SCE), which may refer to a phenomenon whereby electric potential of the channel region is influenced by the drain voltage.

SUMMARY

Embodiments of the present disclosure may provide methods of fabricating semiconductor devices, which can enhance performance and reliability of the semiconductor device, and yield, by way of a surface treatment process that is configured to reduce or cure surface defects, etc. that may be generated due to etch process.

Embodiments of the present disclosure are not limited to that mentioned above, and further embodiments that are not mentioned above can be clearly understood to those skilled in the art based on the description provided below.

According to some embodiments of the present inventive concepts, a method of fabricating a semiconductor device includes forming a recess in a semiconductor substrate adjacent a gate electrode thereon, the recess comprising defects in or on a surface thereof, performing a surface treatment process comprising a deposit process and an etch process, thereby forming a semiconductor liner film on the surface of the recess such that the semiconductor liner film is undoped, and epitaxially growing a doped semiconductor layer the recess responsive to performing the surface treatment process, thereby defining a source/drain region in the semiconductor substrate adjacent the gate electrode.

In some embodiments, the surface of the recess may include high-index crystal planes and low-index crystal planes, and the etch process may etch the high-index crystal planes faster than the low-index crystal planes.

In some embodiments, the deposit process may be free of a dopant gas.

In some embodiments, the deposit process and the etch process may respectively include a same etching gas. For example, the deposit process and the etch process may respectively include a chlorine-based etching gas.

In some embodiments, the surface treatment process may further include a stabilizing interval between the deposit process and the etching process, or between the etching process and the deposit process.

In some embodiments, a flow rate of hydrogen in the deposit process may be greater than or equal to that of the etch process. Additionally or alternatively, a temperature and/or pressure of the deposit process may be less than or equal to that of the etch process.

In some embodiments, the semiconductor liner film may be a same material as the semiconductor substrate.

In some embodiments, before performing the surface treatment process, a native oxide layer on the surface of the recess may be at least partially removed. For example, the native oxide layer may be removed by performing a hydrogen baking process and/or a plasma etching process. In some embodiments, the hydrogen baking process and the surface treatment process may be performed in-situ in a same process chamber.

In some embodiments, forming the recess may include forming first and second recesses adjacent respective gate electrodes on the semiconductor substrate, and epitaxially growing the doped semiconductor layer may define first and second source/drain regions having different dopant concentrations and/or different compositions adjacent the respective gate electrodes in the first and second recesses, respectively. For example, the first source/drain region may correspond to a PMOS device, and the second source/drain region may correspond to an NMOS device.

In some embodiments, a mask pattern may be formed on a region of the substrate corresponding to the NMOS device prior to performing the surface treatment process.

In some embodiments, performing the surface treatment process and epitaxially growing the doped semiconductor layer may be performed in-situ in a same process chamber.

In some embodiments, the substrate may include a semiconductor fin protruding therefrom, and forming the recess may include performing anisotropic and isotropic dry etch processes in a sequential order such that the recess extends into a sidewall of the semiconductor fin.

According to an aspect of the present inventive concepts, there is provided methods for fabricating semiconductor devices comprising forming a fin-type pattern protruding on a substrate; forming a gate electrode intersecting the fin-type pattern; forming a first recess adjacent to the gate electrode, within the fin-type pattern, and by using dry etching; forming a second recess by treating a surface of the first recess with a surface treatment process including a deposit process and an etch process; and forming an epitaxial pattern filling the second recess.

In some embodiments of the present inventive concepts, a first process gas of the deposit process and a second process gas of the etch process each includes an etching gas.

In some embodiments of the present inventive concepts, the etching gas is a chlorine-based gas.

In some embodiments of the present inventive concepts, the first process gas and the second process gas each includes hydrogen, and a flow rate of hydrogen in the first process gas is equal to, or greater than a flow rate of hydrogen in the second process gas.

In some embodiments of the present inventive concepts, the deposit process includes forming a semiconductor liner film along the surface of the first recess, and the semiconductor liner film is an undoped semiconductor film.

In some embodiments of the present inventive concepts, the semiconductor liner film includes one of silicon layer, silicon germanium layer, or germanium layer.

In some embodiments of the present inventive concepts, the etch process is performed after the deposit process, and the etch process includes etching at least a portion of the semiconductor liner film.

In some embodiments of the present inventive concepts, the method may further comprise performing a hydrogen bake process of removing a native oxide layer formed on the surface of the first recess, prior to the surface treatment process.

In some embodiments of the present inventive concepts, the hydrogen bake process is performed at a temperature higher than the surface treatment process.

In some embodiments of the present inventive concepts, the method may further comprise performing a plasma etch process of removing a native oxide layer formed on the surface of the first recess, prior to the surface treatment process.

In some embodiments of the present inventive concepts, a process gas of the plasma etch process includes a mixture gas of nitrogen trifluoride ($NF_3$) and ammonia ($NH_3$).

In some embodiments of the present inventive concepts, the deposit process is performed after the etch process.

In some embodiments of the present inventive concepts, the surface treatment process is performed for a plurality of times.

In some embodiments of the present inventive concepts, the surface treatment process includes a first surface treatment process and a second surface treatment process, the first surface treatment process includes a first deposit process and a first etch process, the second surface treatment process includes a second deposit process and a second etch process, the first deposit process and the second deposit process have substantially identical process conditions, and the first etch process and the second etch process have substantially identical process conditions.

In some embodiments of the present inventive concepts, a temperature for performing the deposit process is equal to, or lower than a temperature for performing the etch process.

In some embodiments of the present inventive concepts, the dry etching includes anisotropic dry etching and isotropic dry etching performed in a sequential order.

According to another aspect of the present inventive concepts, there is provided methods for fabricating semiconductor devices comprising forming a fin-type pattern protruding on a substrate; forming a gate electrode intersecting the fin-type pattern; forming a first recess adjacent to the gate electrode, within the fin-type pattern; removing a native oxide layer formed on a surface of the first recess with a plasma etch process, in an etch chamber of an epitaxial deposition equipment; after removing the native oxide layer, forming a second recess by curing surface defects on the surface of the first recess with a surface treatment process including a deposit process and an etch process, in the deposition chamber of the epitaxial deposition equipment; and forming an epitaxial pattern filling the second recess.

In some embodiments of the present inventive concepts, the method may further comprise further comprising performing a hydrogen bake process of removing the native oxide layer in the deposition chamber, prior to the surface treatment process.

In some embodiments of the present inventive concepts, by the surface treatment process, a semiconductor film having a dopant is not formed along the surface of the first recess.

In some embodiments of the present inventive concepts, a process gas of the surface treatment process comprises a chlorine-based etching gas.

According to still another aspect of the present inventive concepts, there is provided methods for fabricating semiconductor devices comprising forming a fin-type pattern protruding on a substrate; forming a gate electrode intersecting the fin-type pattern; forming a recess adjacent to the gate electrode, within the fin-type pattern; and treating a surface of the recess with a surface treatment process including a deposit process and an etch process, wherein a flow rate of hydrogen of the deposit process is equal to, or greater than a flow rate of hydrogen of the etch process, and a pressure for performing the deposit process is equal to, or lower than a pressure for performing the etch process.

In some embodiments of the present inventive concepts, a temperature for performing the deposit process is equal to, or lower than a temperature for performing the etch process.

In some embodiments of the present inventive concepts, a first process gas of the deposit process and a second process gas of the etch process each includes a chlorine-based etching gas.

According to still another aspect of the present inventive concepts, there is provided methods for fabricating semiconductor devices comprising forming a first fin-type pattern in a PMOS region and a second fin-type pattern in an NMOS region; forming a first gate electrode intersecting the first fin-type pattern, and a second gate electrode intersecting the second fin-type pattern; forming a first recess adjacent to the gate electrode, within the fin-type pattern, and by using dry etching; forming a second recess by treating a surface of the first recess with a first surface treatment process including a first deposit process and a first etch process; forming a first epitaxial pattern filling the second recess; and forming a second epitaxial pattern adjacent to the second gate electrode, within the second fin-type pattern.

In some embodiments of the present inventive concepts, forming the second epitaxial pattern includes forming a third recess adjacent to the second gate electrode, within the second fin-type pattern, and the second epitaxial pattern fills the third recess.

In some embodiments of the present inventive concepts, forming the second epitaxial pattern includes forming a third recess adjacent to the second gate electrode, within the second fin-type pattern, and by using dry etching, and forming a fourth recess by treating a surface of the second recess with a second surface treatment process including a second deposit process and a second etch process. The second epitaxial pattern fills the fourth recess.

In some embodiments of the present inventive concepts, by the first surface treatment process, a semiconductor film having a p-type dopant is not formed along the surface of the first recess.

According to still another aspect of the present inventive concepts, there is provided methods for fabricating semiconductor devices comprising forming a gate electrode on a substrate; forming a first recess adjacent to the gate electrode, by partially removing the substrate; and forming a second recess by treating a surface of the first recess with a surface treatment process including a deposit process and an etch process, wherein, by the surface treatment process, a semiconductor film having a dopant is not formed along the surface of the first recess.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which:

FIGS. 1A to 11B are views provided to explain methods of fabricating semiconductor devices according to some example embodiments;

DETAILED DESCRIPTION

Figure 1A:
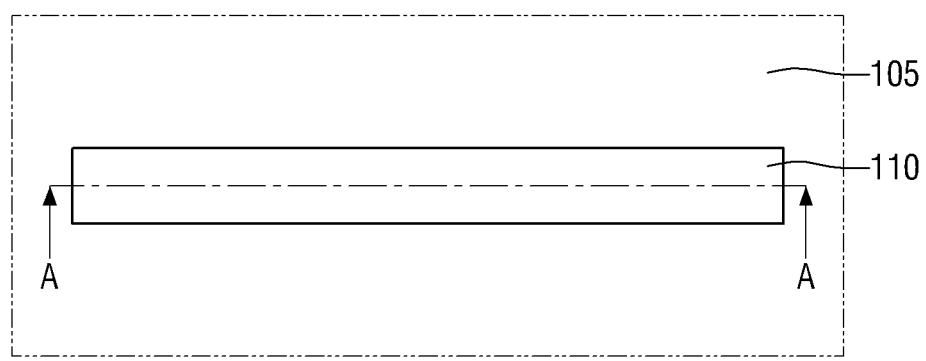

Advantages and features of the present inventive concepts and methods of accomplishing the same may be understood more readily by reference to the following detailed description of embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concepts will be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when an element or layer is referred to as being "on" another element or layer, it can be directly on the other element or layer, or intervening elements or layers may also be present. In contrast, when an element or layer is referred to as being "directly on" another element or layer, there are no intervening elements or layers present.

It will be understood that, although the terms first, second, etc. may be used herein to describe various elements, these elements should not be limited by these terms. These terms are used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless defined otherwise, all technical and scientific terms used herein have the same meaning as commonly understood by one of ordinary skill in the art to which these inventive concepts belong. It is noted that the use of any and all examples, or example terms provided herein is intended merely to better illuminate the inventive concepts and is not a limitation on the scope of the inventive concepts unless otherwise specified. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinbelow, methods of fabricating semiconductor devices according to some example embodiments will be explained with reference to FIGS. 1A to 11B.

FIGS. 1A to 11B are views provided to explain methods of fabricating semiconductor devices according to some example embodiments.

Figure 1B:
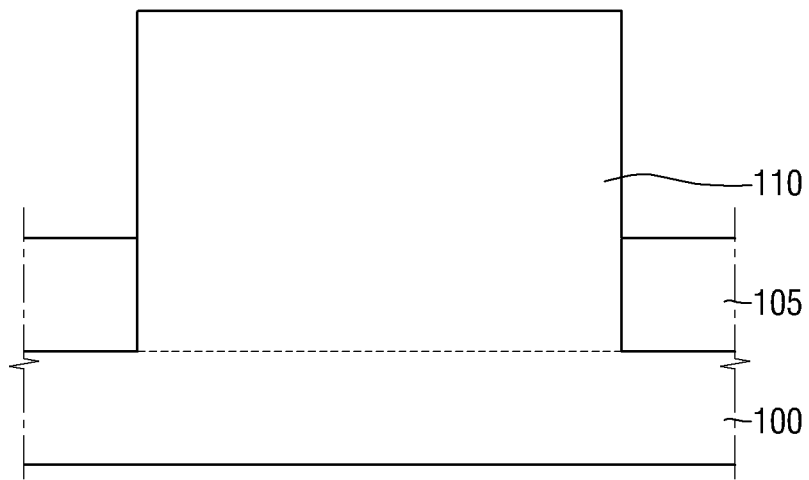
Figure 2A:
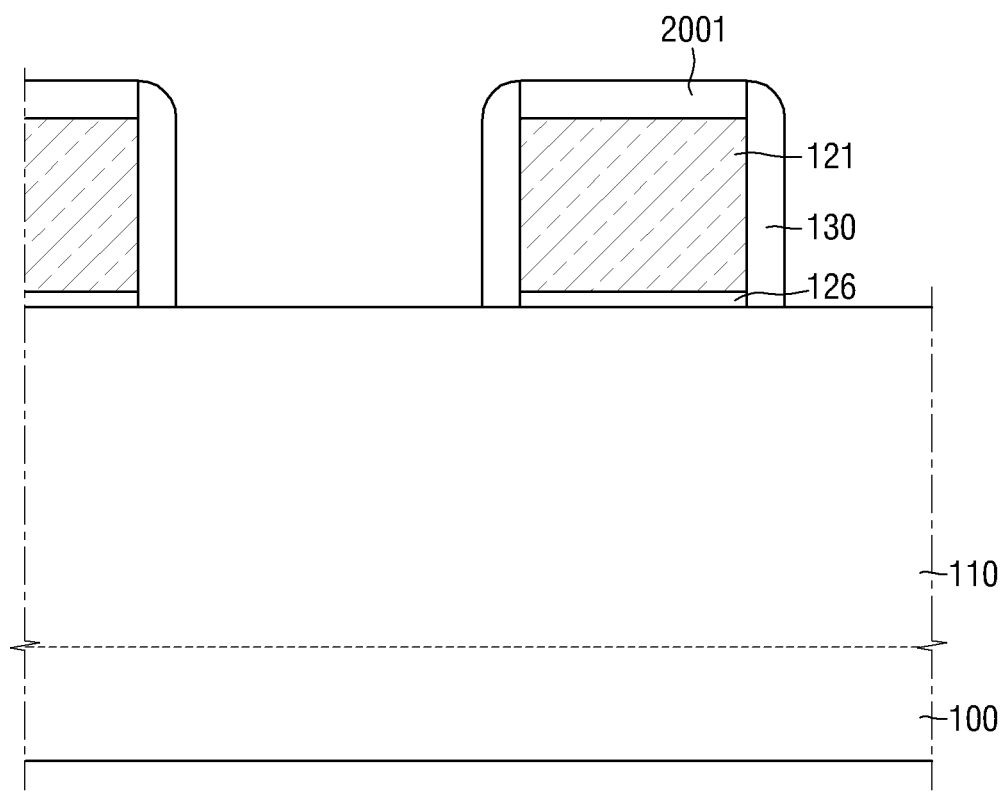
Figure 2B:
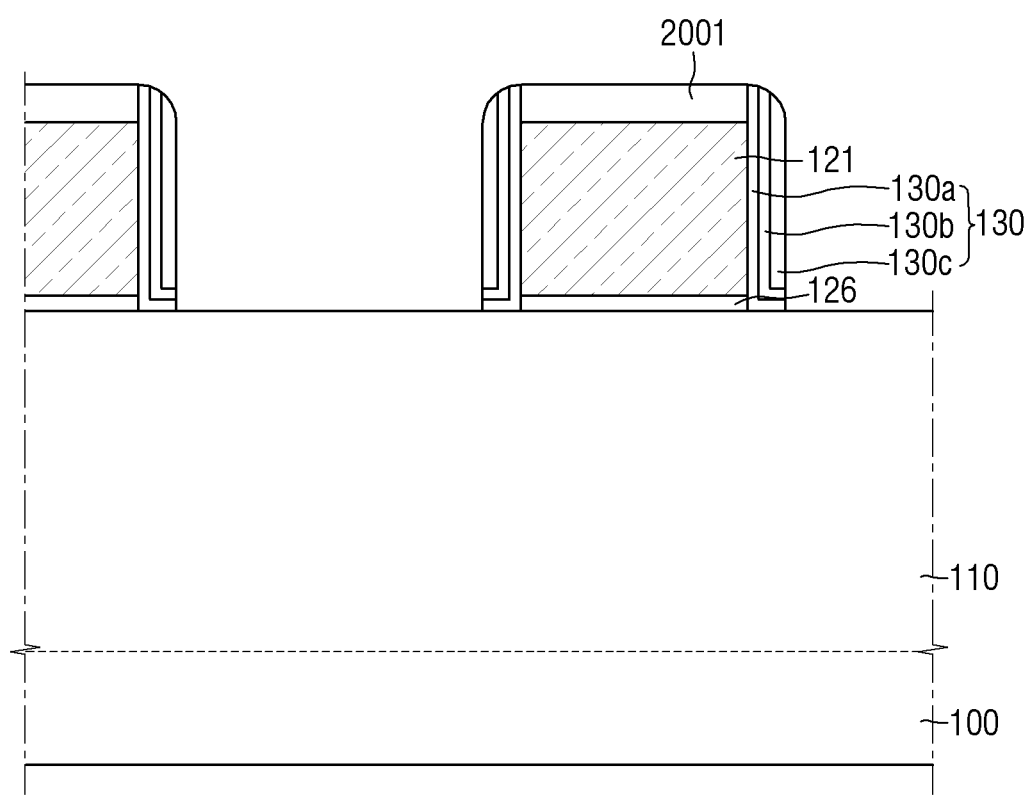
Figure 4:
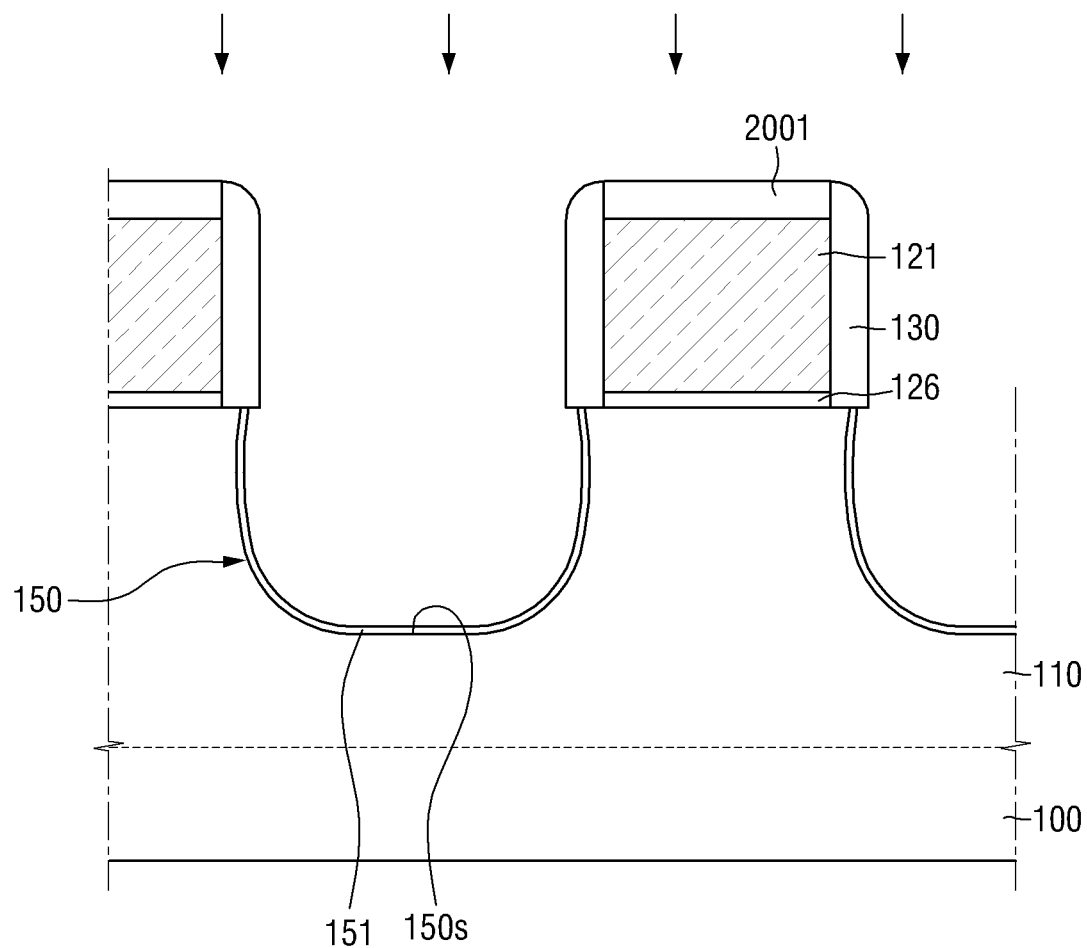
Figure 5:
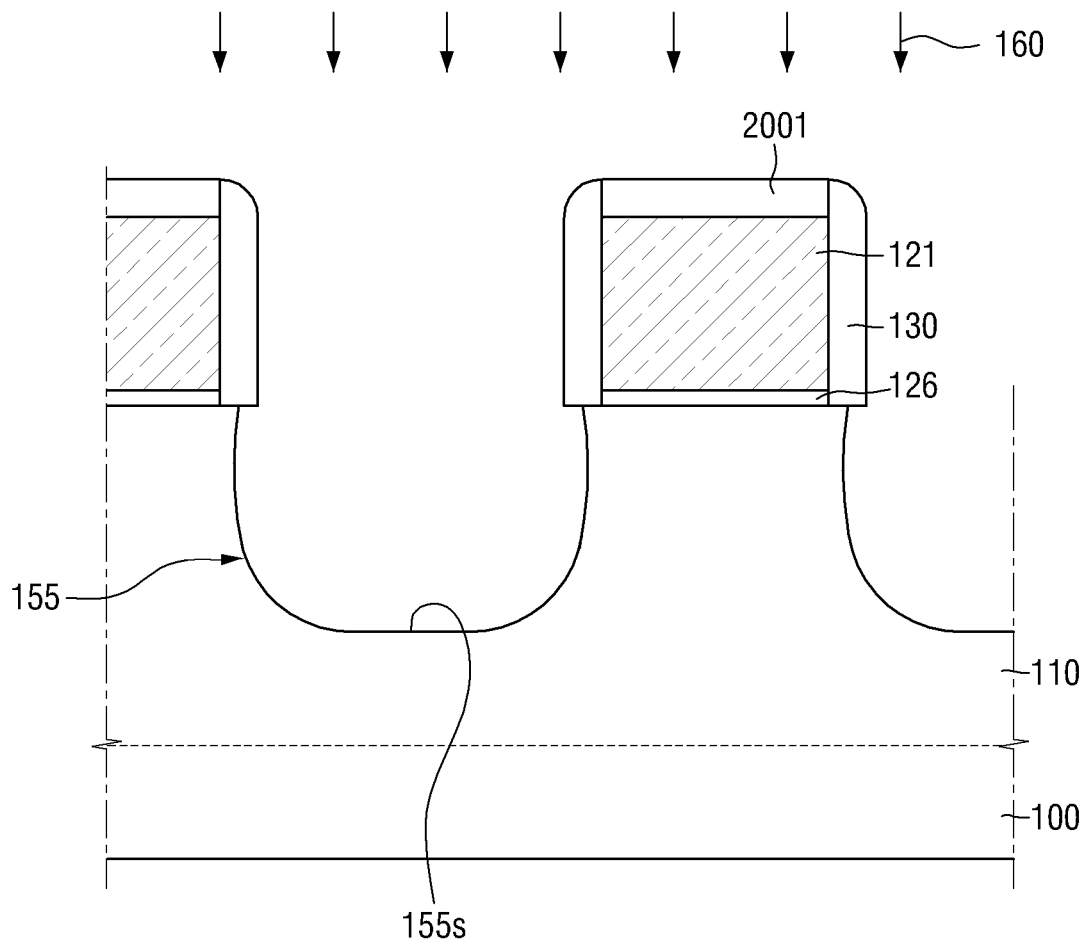
Figure 6A:
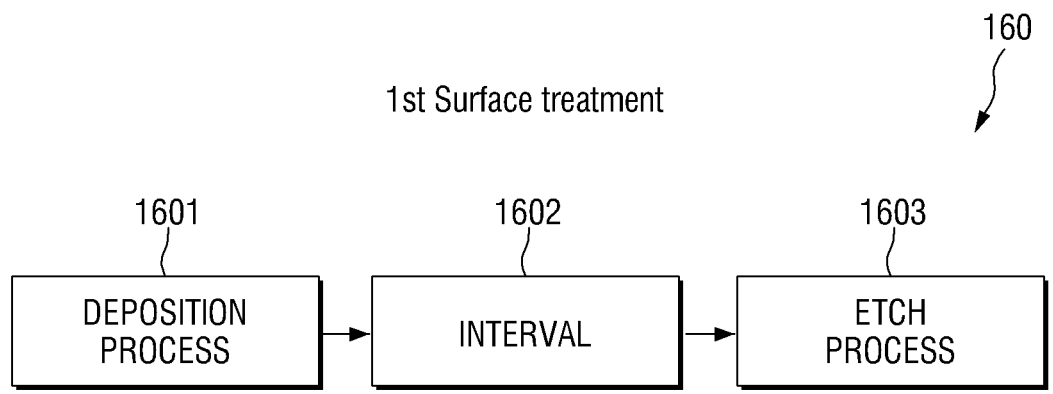
Figure 6B:
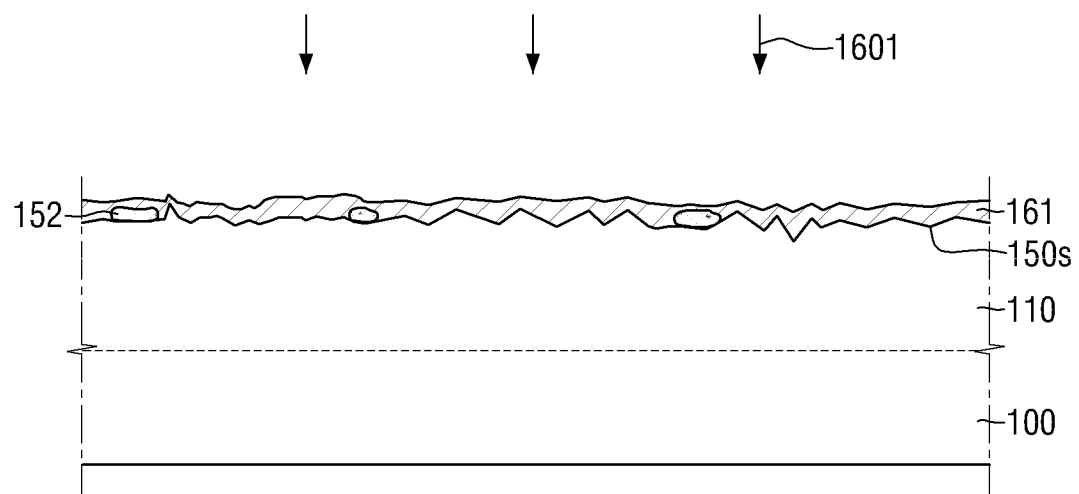
Figure 6C:
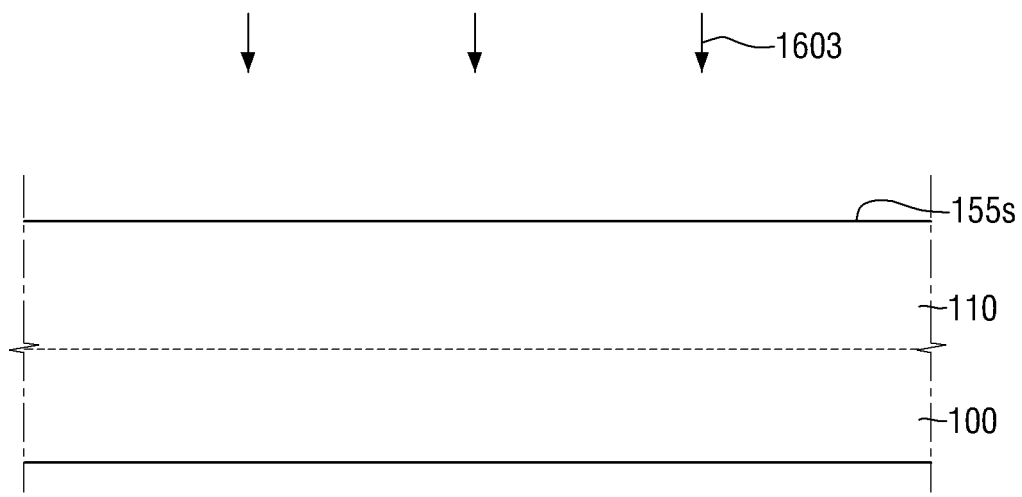
Figure 7:
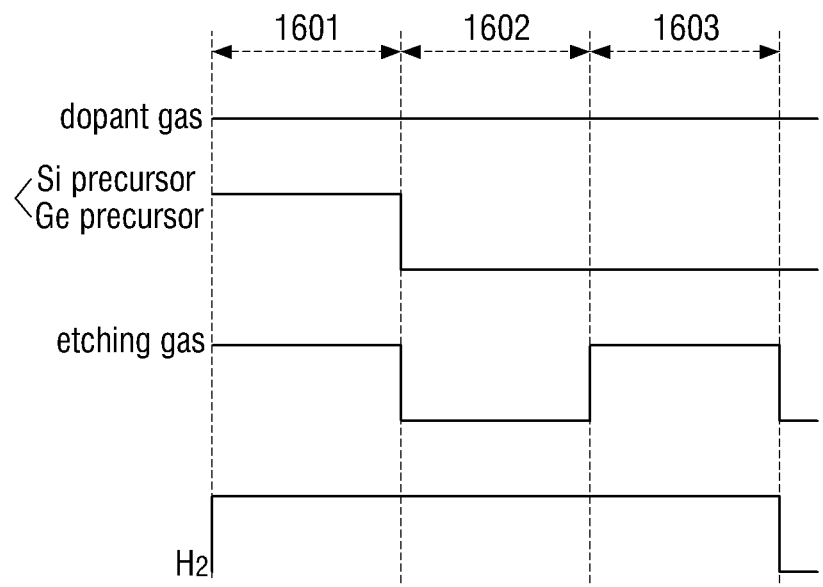
Figure 8:
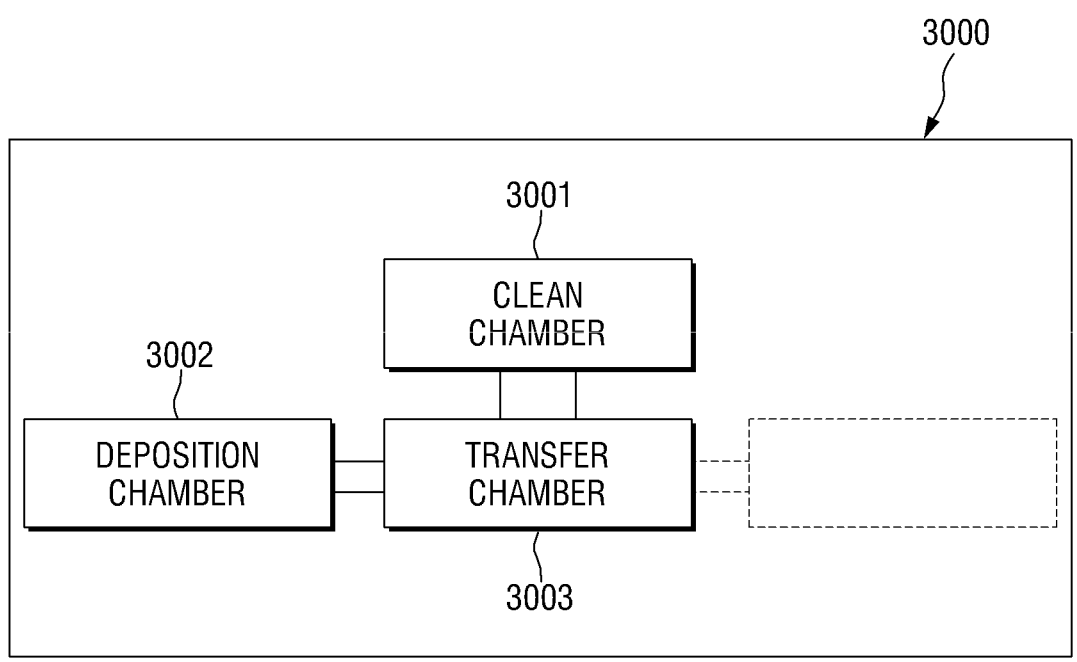

More specifically, FIGS. 1A to 2 are views illustrating fin-type pattern and gate electrode on the fin-type pattern. FIG. 1B is a cross sectional view taken on line A-A of FIG. 1A. FIG. 2A is a view illustrating an example in which a gate spacer is a single layer. FIG. 2B is a view illustrating an example in which the gate spacer is a multi-layer. FIG. 3 is a view illustrating a recess formed within a fin-type pattern. FIG. 4 is a view illustrating a native oxide layer formed on a surface of the recess. FIG. 5 is a view illustrating surface-treating the surface of the recess. FIGS. 6A to 6C are views provided to explain a surface treatment process. FIG. 7 is a timing diagram provided to explain a flow of process gas in the surface treatment process. FIG. 8 is a block diagram illustrating integrated process equipment. FIGS. 9 to 11B are views provided to explain a process after surface treatment process.

While the drawings exemplify methods of fabricating a fin-type transistor (FinFET) including a fin-type pattern shape channel region, the example embodiments are not limited thereto. Methods of fabricating semiconductor devices according to some example embodiments may also be applied to fabricate a tunneling FET, a transistor including nanowires, a transistor including nanosheet, or a three-dimensional (3D) transistor. Further, methods of fabricating semiconductor devices according to some example embodiments may also be used for methods of fabricating a bipolar junction transistor, a laterally diffused metal oxide semiconductor (LDMOS), etc.

Moreover, as described herein, methods of fabricating semiconductor devices according to some example embodiments may be applied or described with reference to fabricating a multi-channel transistor by using fin-type pattern, but not limited thereto. Accordingly, the method may be applied to fabricating a planar transistor.

Referring to FIGS. 1A and 1B, a first fin-type pattern 110 protruding from the substrate 100 is formed.

The substrate 100 may be a bulk silicon or a silicon-on-insulator (SOI). In other embodiments, the substrate 100 may be a silicon substrate, or may include other substance such as, for example, silicon germanium, silicon germanium on insulator (SGOI), indium antimonide, lead telluride compound, indium arsenide, indium phosphide, gallium arsenide, or gallium antimonide, but not limited thereto.

The first fin-type pattern 110 may be extended longitudinally in one direction. The fin-type pattern 110 may be formed by partially etching the substrate 100, and may include an epitaxial layer grown from the substrate 100.

The first fin-type pattern 110 may include an element semiconductor material such as silicon or germanium, for example. Further, the first fin-type pattern 110 may include a compound semiconductor such as, for example, IV-IV group compound semiconductor or III-V group compound semiconductor.

For example, with reference to the IV-IV group compound semiconductors, the first fin-type pattern 110 may be a binary compound or a ternary compound including, for example, at least two or more of carbon (C), silicon (Si), germanium (Ge), or tin (Sn), or the above-mentioned binary or ternary compound doped with IV group element.

With reference to the III-V group compound semiconductors, for instance, the first fin-type pattern 110 may be a binary compound, a ternary compound or a quaternary compound which is formed by a combination of a III group element which may be at least one of aluminum (Al), gallium (Ga), or indium (In), with a V group element which may be one of phosphorus (P), arsenic (As) or antimony (Sb).

Methods of fabricating semiconductor devices according to some example embodiments are described herein with reference to embodiments where the first fin-type pattern 110 is a fin-type pattern which includes silicon.

A field insulating layer 105 may be formed on the substrate 100. The field insulating layer 105 may partially cover a sidewall of the first fin-type pattern 110. In other words, the first fin-type pattern 110 may protrude above the field insulating layer 105.

For example, the field insulating layer 105 may be an oxide film, a nitride film, an oxynitride film or a film combining these.

The following description is based on a cross sectional view taken on line A-A of FIG. 1A. Further, subsequent drawings after FIG. 1A illustrate a part of the first fin-type pattern 110 except the field insulating layer 105.

Referring to FIGS. 2A and 2B, a first dummy gate electrode 121 intersecting the first fin-type pattern 110 is formed on the first fin-type pattern 110.

A first dummy gate insulating layer 126, the first dummy gate electrode 121, and a gate hard mask 2001 may be formed on the first fin-type pattern 110, being sequentially stacked on one another. Patterning a dummy insulating layer and a dummy electrode film by using a gate hard mask 2001 as a mask may cause the first dummy gate insulating layer 126 and the first dummy gate electrode 121 to be formed.

Next, a first gate spacer 130 may be formed on a sidewall of the first dummy gate electrode 121.

For example, the first dummy gate insulating layer 126 may include silicon oxide, silicon oxynitride, silicon nitride, or combinations thereof. The first dummy gate insulating layer 126 may be formed by using, for example, heat treatment, chemical substance treatment, atomic layer deposition (ALD) or chemical vapor deposition (CVD), etc.

The first dummy gate electrode 121 may be silicon, for example, and more specifically, may include one of polycrystalline silicon (poly Si), amorphous silicon (a-Si), or combinations thereof. The first dummy gate electrode 121 may not be doped with impurity, or may be doped with impurity.

The poly Si may be formed by using, for example, the CVD, and the a-Si may be formed by using, for example, sputtering, CVD, plasma deposition, etc., although example embodiments are not limited thereto.

The gate hard mask 2001 may include nitride film, oxide film, or combinations thereof, for example. The gate hard mask 2001 may be formed by using CVD, for example.

For example, the first spacer 130 may include at least one of silicon nitride layer, silicon oxynitride layer, silicon oxide layer, or silicon oxycarbon nitride (SiOCN) layer. The first gate spacer 130 may be formed by using, for example, CVD, ALD, etc.

FIG. 2A illustrates an example in which the first gate spacer 130 is formed as a single layer.

FIG. 2B illustrates an example in which the first gate spacer 130 is formed as a multi-layer. As illustrated in FIG. 2B, the first gate spacer 130 may be a triple layer including a first portion 130a, a second portion 130b and a third portion 130c, although example embodiments are not limited thereto.

For example, when the first gate spacer 130 is formed as a triple layer, at least one of the first to the third portions 130a, 130b, 130c of the first gate spacer 130 may have an L-shape.

As illustrated in FIG. 2B, the first portion 130a of the first gate spacer and the second portion 130b of the first gate spacer may each have an L-shape. However, this is provided for convenience of illustration, and example embodiments are not limited thereto. That is, it is of course possible that one of the first portion 130a of the first gate spacer and the second portion 130b of the first gate spacer may have an L-shape.

Further, at least one of the first portion 130a of the first gate spacer, the second portion 130b of the first gate spacer, or the third portion 130c of the first gate spacer may include a low-k material such as silicon oxycarbon nitride (SiOCN) layer.

In describing methods of fabricating semiconductor devices according to some example embodiments, it is explained that the first dummy gate electrode 121 is replaced with a replacement metal gate in the subsequent process, but example embodiments are not limited thereto.

That is, the first dummy gate electrode 121 may be utilized as an actual gate electrode of a transistor, rather than serving as a mold to ensure space for the subsequent process. When the first dummy gate electrode 121 is utilized as an actual gate electrode of the transistor, the first dummy gate electrode 121 may include metal material. This will be described with reference to FIG. 11A.

Additionally, the first dummy gate insulating layer 126 may also be utilized as an actual gate insulating layer of the transistor. When the first dummy gate insulating layer 126 is utilized as an actual gate insulating layer of the transistor, the first dummy gate insulating layer 126 may include high-k dielectric film. This will be described with reference to FIG. 11A.

For convenience of explanation, the subsequent explanation will refer to a fabrication process that is performed by using the example of FIG. 2A.

Referring to FIG. 3, a first recess 150 may be formed within the first fin-type pattern 110. The first recess 150 may be formed adjacent to the first dummy gate electrodes 121.

In other words, the first recess 150 may be formed by dry etching the first fin-type pattern 110 exposed between the first dummy gate electrodes 121.

The dry etching may include, for example, anisotropic dry etching and isotropic dry etching.

For one example, a first pre-recess 150$p$, being adjacent to the first dummy gate electrodes 121, may be formed within the first fin-type pattern 110, by using anisotropic dry etching. Next, the first recess 150 may be formed by extending the first pre-recess 150$p$, by using isotropic dry etching.

For example, the anisotropic dry etching may use plasma including fluorine (F) and argon (Ar). For the plasma including fluorine (F) and argon (Ar), for example, $NF_3$/Ar, $CF_4$/$O_2$/Ar or $CHF_3$/$O_2$/Ar plasma may be used, although example embodiments are not limited thereto.

For example, the isotropic dry etching may use the plasma of gas including substance with high reactivity with silicon, such as chlorine ($Cl_2$) gas, gas including hydrogen bromide (HBr) and chlorine ($Cl_2$), gas including sulfur hexafluorine ($SF_6$) and chlorine ($Cl_2$), or gas including at least one of hydrogen bromide (HBr), chlorine ($Cl_2$) or sulfur hexafluorine ($SF_6$), but not limited thereto.

As a result, the first recess 150, having an elliptical undercut shape, may be formed under the first dummy gate electrode 121. That is, the first recess 150 may be formed by using anisotropic dry etching and isotropic dry etching performed in sequential order.

In another example, the first fin-type pattern 110, exposed between the first dummy gate electrodes 121, may be initially etched vertically, by using isotropic dry etching. Next, when the first fin-type pattern 110 left uncovered by the first gate spacer 130 is exposed by the vertical direction etching, etching in horizontal direction may be performed.

As a result, the first recess 150, being adjacent to the first dummy gate electrodes 121, may be formed within the first fin-type pattern 110.

Referring to FIG. 4, a native oxide layer 151 may be formed on a surface 150$s$ of the first recess. The native oxide layer 151 formed on the surface 150$s$ of the first recess may be removed by plasma etch process.

In order to form the first epitaxial pattern 140 (FIG. 9) to be described below, cleaning process such as the plasma etch process to remove the native oxide layer 151 may be performed.

Plasma etchant for use in the plasma etch process may be formed by ionizing a mixture gas of nitrogen trifluoride ($NF_3$) and ammonia ($NH_3$). Chemical formula represents etch radical formed by ionized nitrogen trifluoride ($NF_3$) and ammonia ($NH_3$).

$$NF_3+NH_3 \rightarrow NH_4F+NH_4F \cdot HF$$ (Chemical formula)

The radical of the Chemical formula reacts with the native oxide layer 151, forming $(NH_4)_2SiF_6$ as an etch by-product. The etch by-product ($(NH_4)_2SiF_6$) may be evaporated to gas state by the heat treatment.

For example, at temperature range from 80° C. to 300° C. and pressure range from 0.1 Torr to 10 Torr, the etch by-product ($(NH_4)_2SiF_6$) may be decomposed into silicon tetrafluoride ($SiF_4$), ammonia ($NH_3$), and hydrogen fluoride (HF).

The plasma etch process may at least partially remove the native oxide layer 151 formed on the surface 150$s$ of the first recess.

The native oxide layer 151 formed on the surface 150$s$ of the first recess 150 may not form an overall constant thickness. Accordingly, a portion of the native oxide layer 151 may remain after the plasma etch process.

Referring to FIGS. 5 to 8, the surface 150$s$ of the first recess may be surface-treated by using the first surface-treatment process 160.

By surface-treating the surface 150$s$ of the first recess, a second recess 155 adjacent to the first dummy gate electrodes 121 may be formed. In other words, the first surface treatment process 160 is configured to reduce the defects in or on the surface 150$s$ of the first recess 150, such that the surface treatment process may result in a treated recess 155 having improved surface characteristics, also referred to herein as a second recess 155.

As explained with reference to FIG. 3, when the first recess 150 is formed by using dry etching, the surface 150$s$ of the first recess may include numerous types of defects.

In one example, during dry etching, the particles including plasma radicals etc. that enter the first fin-type pattern 110 form the first recess 150 by partially removing the first fin-type pattern 110.

Meanwhile, collision among the particles including plasma radicals etc. may cause atomic arrangement on the crystal planes of the surface 150$s$ of the first recess to be broken or deformed. Further, collision among the particles including plasma radicals etc. may cause damages to some of the atoms on the crystal planes of the surface 150$s$ of the first recess.

Due to such collision of the particles, the lattice structure of the surface 150$s$ of the first recess may be broken, deformed or damaged, thus hindering growth of a high-quality characteristic epitaxial layer on the surface 150$s$ of the first recess. This is because the epitaxial layer grown by the epitaxial process is considerably influenced by the underlying lattice structure, i.e., by the lattice structure on the surface 150$s$ of the first recess.

In order to form a high-quality characteristic epitaxial layer that fills the first recess 150, it is advantageous to reduce or cure the surface defects of the surface 150$s$ of the first recess.

In another example, while dry etching continues, there may be a mixture of several types of crystal planes present on the surface 150$s$ of the first recess formed by the particles including plasma radicals, etc. It may not be the presence of the mixture of several types of crystal planes that hinders the formation of a high-quality characteristic epitaxial layer filling the first recess 150.

It may be because the preferential growth crystal plane of the epitaxial layer filling the first recess 150 can be determined depending on conditions for processing the epitaxial process. That is, when the surface 150s of the first recess has a mixture of crystal planes of low index and crystal planes of high index, the growth rate of the epitaxial layer according to the crystal planes may vary. As a result, a high-quality characteristic epitaxial layer filling the first recess 150 may not be formed.

That is, in order to form a high-quality characteristic epitaxial layer that fills the first recess 150, it is advantageous to reduce the high-index crystal planes that are exposed to or at the surface 150s of the first recess.

In another example, during dry etching, the particles including plasma radicals, etc. may collide against not the first fin-type pattern 110, but also the first gate spacer 130, etc.

The collision of the particles including plasma radicals, etc. against the first gate spacer 130, etc. may cause the materials forming the first gate spacer 130, etc. to be detached. These detached materials may react with the particles including plasma radicals, etc.

The contaminants produced from the reaction between the materials detached from the first gate spacer 130, etc., with the plasma radical, etc., may be deposited back onto the surface 150s of the first recess. The contaminants deposited on the surface of the first recess may not be removed by the plasma etch process, etc. described above with reference to FIG. 4.

Due to the contaminants deposited on the surface 150s of the first recess, the high-quality characteristic epitaxial layer filling the first recess 150 may not be formed.

Accordingly, in order to form a high-quality characteristic epitaxial layer that fills the first recess 150, it is advantageous to remove the contaminants deposited on the surface 150s of the first recess.

In another example, the native oxide layer formed on the surface 150s of the first recess may not be entirely removed by the plasma etch process, etc.

When the native oxide layer remains on the surface 150s of the first recess, the remaining native oxide layer may hinder growth of a high-quality characteristic epitaxial layer filling the first recess 150.

Accordingly, in order to form a high-quality characteristic epitaxial layer that fills the first recess 150, it is advantageous to remove the native oxide layer remaining on the surface 150s of the first recess.

While a few types of surface defects that may be present on the surface 150s of the first recess are described above, the example embodiments are not limited thereto.

As a result, in order to form a high-quality characteristic epitaxial layer which is adjacent to the first dummy gate electrode 121 and formed within the first fin-type pattern 110, it is advantageous to reduce or cure the surface defects that may be present on the surface 150s of the first recess.

FIG. 6B is an enlarged view illustrating a portion of the surface 150s of the first recess.

Referring to FIG. 6B, the surface 150s of the first recess is illustrated to exemplify a surface with broken or deformed crystal planes, and example embodiments are not limited thereto. Further, there may be the contaminants 152 etc., deposited or produced on the surface 150s of the first recess.

Referring to FIG. 6A to FIG. 7, the first surface treatment process 160 includes deposit process 1601 and etch process 1603. The first surface treatment process 160 may include a stabilizing interval 1602 between the deposit process 1601 and the etch process 1603.

The first surface treatment process 160 may be performed in the order of the deposit process 1601 and then the etch process 1603.

By the deposit process 1601, a semiconductor liner film 161 may be formed along the surface 150s of the first recess. The semiconductor liner film 161 may include one of, for example, silicon layer, silicon germanium layer, or germanium layer, but not limited thereto.

The material included in the semiconductor liner film 161 may vary depending on a material that is included in the first fin-type pattern 110 exposed to the first recess 150.

That is, when the surface 150s of the first recess includes silicon, the semiconductor liner film 161 may include a silicon layer, and when the surface 150s of the first recess includes silicon germanium, the semiconductor liner film 161 may include a silicon germanium layer. Further, when the surface 150s of the first recess includes germanium, the semiconductor liner film 161 may include a germanium layer.

As an alternative to above, the first fin-type pattern 110 exposed by the first recess 150 may include a III-V compound semiconductor, in which case the semiconductor liner film 161 may include a III-V compound semiconductor layer. That is, the semiconductor liner film 161 may be the same material as the surface 150s in some embodiments.

However, the above example is provided for convenience of explanation, and the present disclosure is not limited thereto.

As the semiconductor liner film 161 is formed along the surface 150s of the first recess including surface defects, the lattice structure of the surface 150s of the first recess, deformed or damaged by the dry etching, may be rearranged.

The semiconductor liner film 161 may aid the lattice structure of the surface 150s of the first recess, which is broken or deformed, to recover into a crystal plane where a high-quality characteristic epitaxial layer can grow. Additionally, the semiconductor liner film 161 may aid the lattice structure of the surface 150s of the first recess to recover into a crystal plane where the high-quality characteristic epitaxial layer can grow, by supplying atoms to the lattice structure of the surface 150s of the first recess where the atoms are lost.

The first process gas of the deposit process 1601 to form the semiconductor liner film 161 may include a source precursor to provide a material included in the semiconductor liner film 161, hydrogen, and etching gas.

However, the first process gas of the deposit process 1601 does not include a precursor to supply a dopant. Indeed, as shown in FIG. 7, a dopant gas is not present in any of the deposit process 1601, interval 1602, or etch process 1603. Accordingly, the semiconductor liner film 161 formed by the deposit process may be an undoped semiconductor film.

Accordingly, the semiconductor liner film 161 formed along the surface 150s of the first recess does not include a p- or n-type dopant. Due to the deposit process 1601, a semiconductor liner film 161 including a dopant is not formed along the surface 150s of the first recess 150. In other words, due to the first surface treatment process 160, the semiconductor liner film 161, which is formed along the surface 150s of the first recess 150, is undoped.

When the semiconductor liner film 161 includes one of a silicon layer, silicon germanium layer, or germanium layer, the source precursor included in the first process gas may include a silicon source precursor and/or a germanium source precursor.

Further, the first process gas may include hydrogen as a carrier gas, for example. The etching gas included in the first process gas may include, for example, a chlorine-based etching gas. The chlorine-based etching gas may include chlorine ($Cl_2$), hydrogen chloride (HCl), etc., but not limited thereto.

The deposit process 1601 may be performed by using, for example, chemical vapor deposition (CVD) such as low pressure chemical vapor deposition (LPCVD), atomic layer chemical vapor deposition (ALCVD), ultra-high vacuum chemical vapor deposition (UHVCVD), reduced pressure chemical vapor deposition (RPCVD), etc., or by using molecular beam epitaxy (MBE), etc., but not limited thereto.

By the etch process 1603, at least a portion of the semiconductor liner film 161 formed along the surface 150s of the first recess may be etched.

The etch process 1603 may remove the contaminants 152, etc. on the semiconductor liner film 161 and the surface 150s of the first recess.

Further, the etch process 1603 may remove or alleviate the high-index crystal plane exposed to the surface 150s of the first recess. The high-index crystal plane is energetically more unstable and has lower atom density than a low-index crystal plane, and accordingly, the etch process 1603 etches the high-index crystal plane faster than the low-index crystal plane. That is, the etch process 1603 may be preferential to the high-index crystal plane relative to the low-index crystal plane.

Because the crystal plane of the surface 150s of the first recess can be rearranged by the etch process 1603, a high-quality characteristic epitaxial layer may be grown on the surface 150s of the second recess formed by the first surface treatment process 160.

As illustrated in FIG. 6C, the semiconductor liner film 161 formed by the deposit process 1601 may be entirely removed, but note that this example is provided for convenience of explanation, and embodiments are not limited thereto.

The second process gas of the etch process may include hydrogen and etching gas. The second process gas may include hydrogen as a carrier gas. The etching gas included in the second process gas may include, for example, a chlorine-based etching gas. The chlorine-based etching gas may include chlorine ($Cl_2$), hydrogen chloride (HCl), etc., but not limited thereto.

A stabilizing interval 1602 may be inserted between the deposit process 1601 and the etch process. During the stabilizing interval 1602, the process gas of the first surface treatment process 160 may be modified from the first process gas into the second process gas.

Further, the process temperature of the first surface treatment process 160 may change from a temperature for performing the deposit process 1601 into a temperature for performing the etch process 1603, and the process pressure of the first surface treatment process 160 may change from a pressure for performing the deposit process 1601 into a pressure for performing the etch process 1603. Additionally, during the stabilizing interval 1602, the flow rate of hydrogen in the first process gas may change into the flow rate of hydrogen in the second process gas.

During the stabilizing interval 1602, the process gas of the first surface treatment process 160 may not include an etching gas. That is, the etching gas may be provided during the deposit process 1601 and the etch process 1603, but not between the deposit process 1601 and the etch process 1603.

The temperature for performing the deposit process 1601 in the first surface treatment process 160 may be equal to, or lower than the temperature for performing the etch process 1603. Further, the pressure for performing the deposit process 1601 in the first surface treatment process 160 may be equal to, or lower than the temperature for performing the etch process 1603.

In contrast, in the first surface treatment process 160, the flow rate of hydrogen included in the first process gas of the deposit process 1601 may be equal to, or higher than the flow rate of hydrogen included in the second process gas of the etch process 1603.

As described above, both the first process gas of the deposit process 1601 and the second process gas of the etch process 1603 may include the chlorine-based etching gas. That is, the process gas of the first surface treatment process 160 may include chlorine-based etching gas.

The flow rate of the etching gas included in the first process gas is lower than the flow rate of the etching gas included in the second process gas.

As described above, by the first surface treatment process 160 including the deposit process 1601 and the etch process 1603, the surface defects of the surface 150s of the first recess may be reduced or cured. The second recess 155 may be formed by reducing or curing the surface defects of the surface 150s of the first recess.

The method of fabricating semiconductor devices according to some example embodiments described above with reference to FIGS. 4 to 7 may be performed in an epi-deposition equipment 3000 including a cleaning chamber 3001 and a deposition chamber 3002.

The plasma etch process described with reference to FIG. 4 may be performed in the cleaning chamber 3001, for example, and the first surface treatment process 160 described with reference to FIGS. 5 to 7 may be performed in the deposition chamber 3002.

That is, the plasma etch process and the first surface treatment process may be performed ex-situ, rather than in-situ. With methods of fabricating semiconductor devices according to some example embodiments, the substrate 100 having undergone the plasma etch process in the cleaning chamber 3001 may be moved to the deposition chamber 3002 where the first surface treatment process 160 is performed, through a moving or transfer chamber 3003.

In order to reduce or prevent the native oxide layer from forming again on the surface 150s of the first recess between plasma etch process and the first surface treatment process 160, the substrate 100 may be moved, via the moving chamber 3003, to the deposition chamber 3002.

Figure 9:
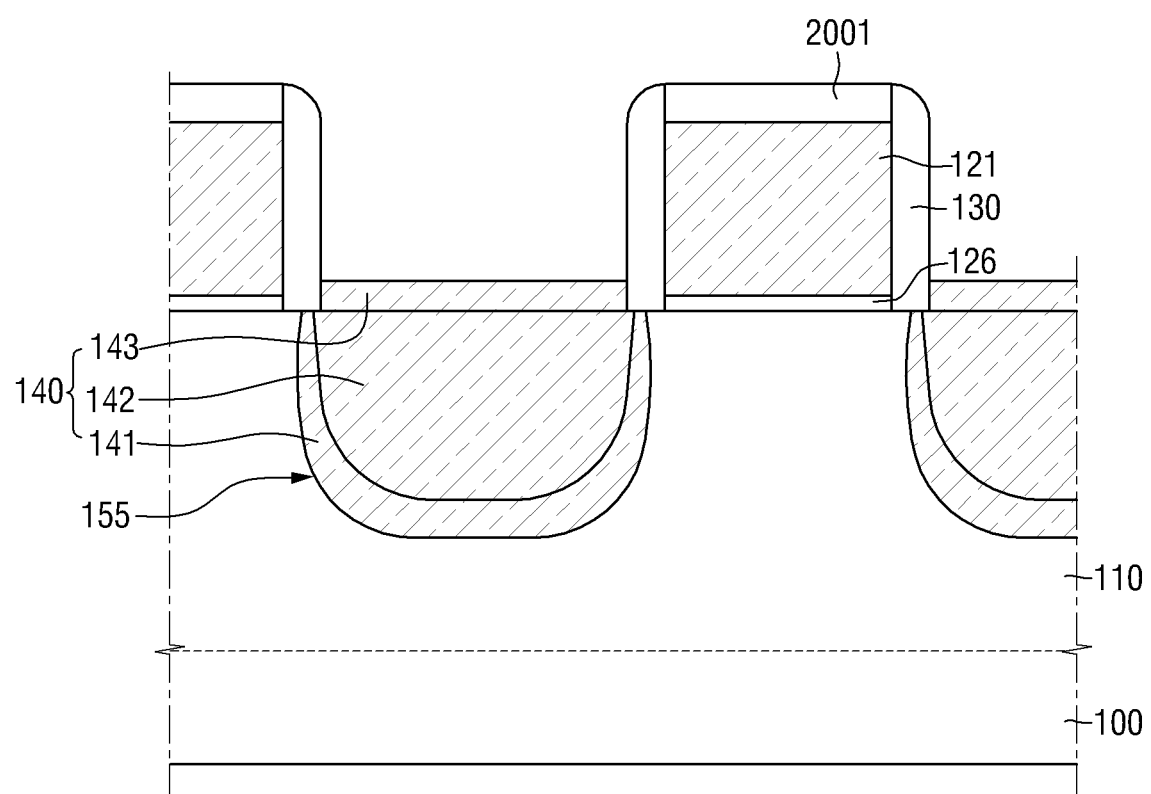

Referring to FIG. 9, a first epitaxial pattern 140 filling the second recess 155 may be formed within the first fin-type pattern 110.

The first epitaxial pattern 140 may be formed by using epitaxial process. The first epitaxial pattern 140 may be formed within the deposition chamber 3002 of FIG. 8.

The first surface treatment process 160 to form the second recess 155 by curing the surface defects on the surface 150s of the first recess, and the epitaxial process to form the first epitaxial pattern 140 may be performed in-situ.

The first epitaxial pattern 140 may be a source/drain region of semiconductor devices fabricated with methods of fabricating semiconductor devices according to some example embodiments of the present disclosure.

When the semiconductor device fabricated according to methods of fabricating semiconductor devices according to some example embodiments is a PMOS transistor, the first epitaxial pattern 140 may include a material that is under compressive strain, also referred to herein as a compressive stress material. For example, the compressive stress material may be a material such as SiGe which has a higher lattice constant compared to Si. For example, the compressive stress material can enhance mobility of the carrier in the channel region by exerting compressive stress on the first fin-type pattern 110.

When the semiconductor device fabricated according to methods of fabricating semiconductor devices according to some example embodiments is an NMOS transistor, the first epitaxial pattern 140 may include a material that is under tensile strain, also referred to herein as a tensile stress material. For example, when the first fin-type pattern 110 is a silicon fin-type pattern, the first epitaxial pattern 140 may be a material such as SiC which has a smaller lattice constant than Si. The tensile stress material can enhance mobility of the carrier in the channel region by exerting tensile stress on the first fin-type pattern 110.

The first epitaxial pattern 140 may include a first lower epitaxial layer 141, a first upper epitaxial layer 142, and a first capping epitaxial layer 143.

For example, when the semiconductor device fabricated according to methods of fabricating semiconductor devices according to some example embodiments is a PMOS transistor, the first epitaxial pattern 140 may include silicon germanium.

The first lower epitaxial layer 141 and the first upper epitaxial layer 142 may include silicon germanium, for example. However, the silicon germanium of the first lower epitaxial layer 141 and the silicon germanium of the first upper epitaxial layer 142 may have different compositions from each other. For example, the proportion of the germanium included in the first upper epitaxial layer 142 may be higher than the proportion of the germanium included in the first lower epitaxial layer 141.

In some embodiments, the silicon germanium of the first lower epitaxial layer 141 and the silicon germanium of the first upper epitaxial layer 142 may have different dopant concentrations from each other. In further embodiments, the silicon germanium of the first lower epitaxial layer 141 and the silicon germanium of the first upper epitaxial layer 142 may have different compositions from each other and may also have different dopant concentrations from each other.

The first capping epitaxial layer 143 may include silicon germanium or silicon.

When the semiconductor device fabricated according to methods of fabricating semiconductor devices according to some example embodiments is an NMOS transistor, the first epitaxial pattern 140 may include silicon.

In this case, the first epitaxial pattern 140 may include three layers as illustrated, but not limited thereto.

Figure 10:
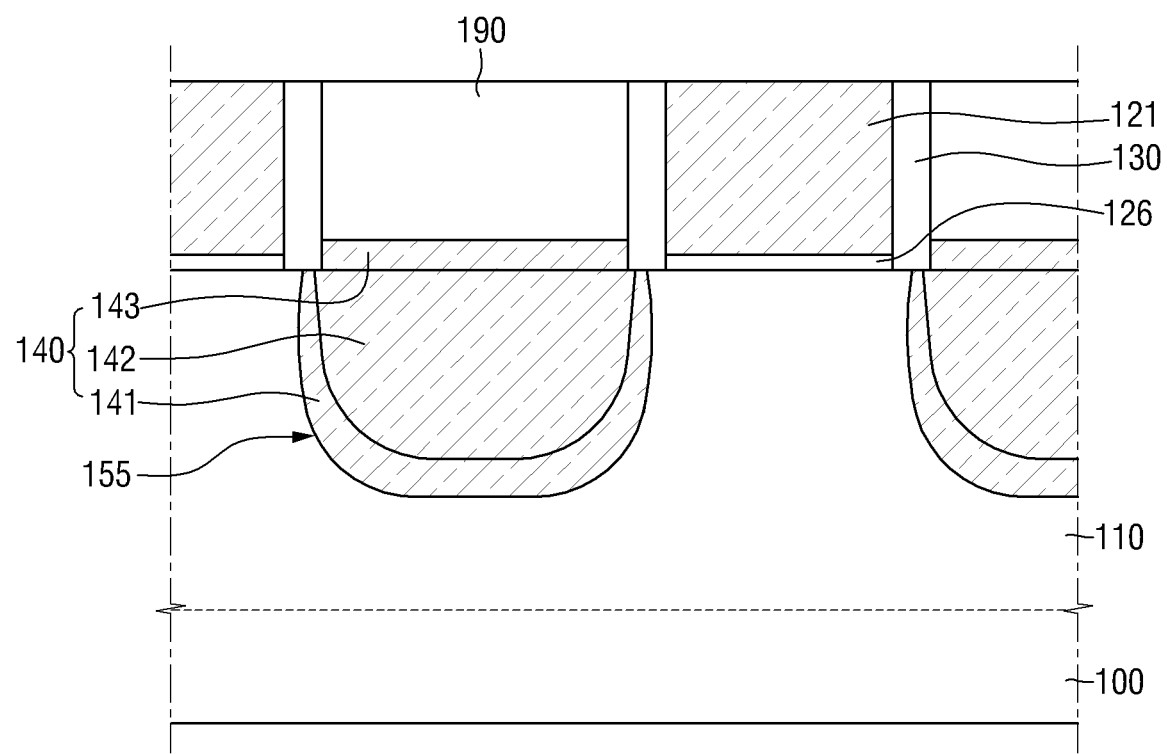

Referring to FIG. 10, a first interlayer insulating layer 190 covering the first dummy gate electrode 121 may be formed.

Next, the first interlayer insulating layer 190 may be planarized until the upper surface of the first dummy gate electrode 121 is exposed. Accordingly, the gate hard mask 2001 may be removed.

The first interlayer insulating layer 190 may include at least one of silicon oxide, silicon nitride, silicon oxynitride, or low-k dielectric material, for example. For example, the low-k dielectric material may include flowable oxide (FOX), Tonen silazen (TOSZ), undoped silica glass (USG), boro-silica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Figure 11A:
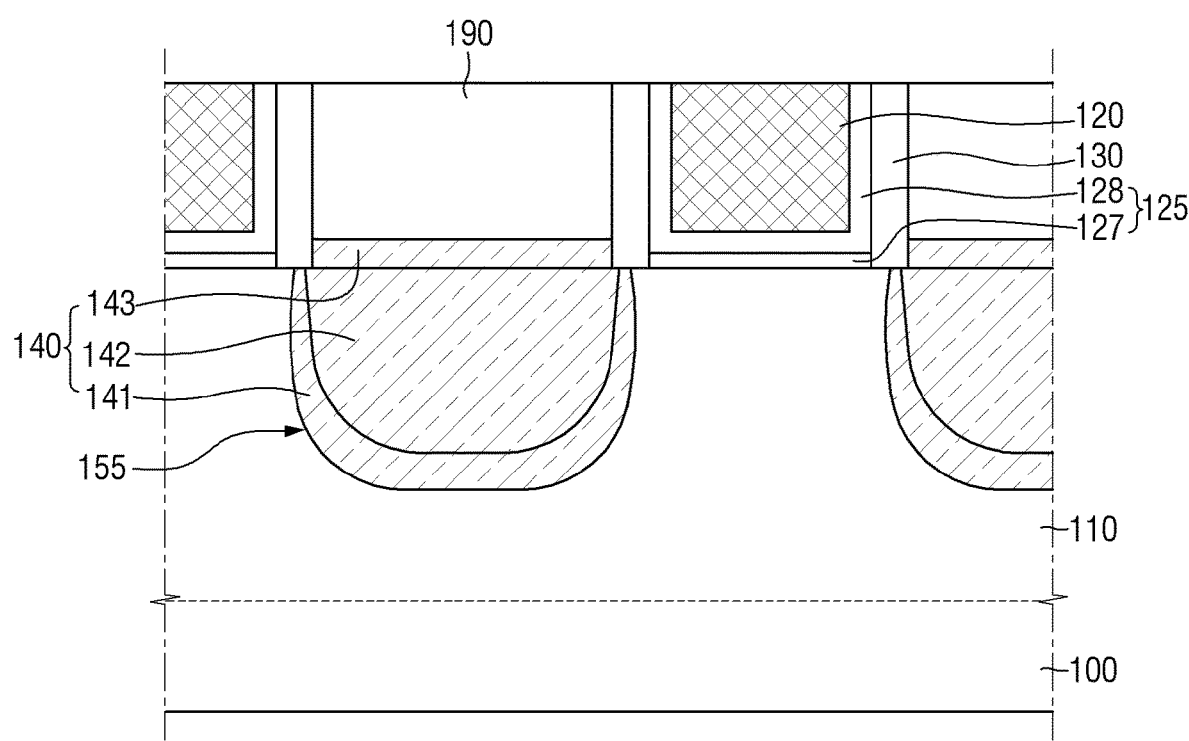

Referring to FIG. 11A, a portion of the first fin-type pattern 110 may be exposed by removing the first dummy gate electrode 121 and the first dummy gate insulating layer 126.

Next, a first interfacial layer 127 and a first gate insulating layer 125 including a first high-k dielectric insulating layer 128 may be formed at locations where the first dummy gate electrode 121 and the first dummy gate insulating layer 126 are removed.

The first gate electrode 120 may then be formed on the first gate insulating layer 125.

The first interfacial layer 127 may be formed on the first fin-type pattern 110. When the first fin-type pattern 110 includes silicon, the first interfacial layer 127 may include silicon oxide layer. The material included in the first interfacial layer 127 may vary depending on a material of the first fin-type pattern 110.

In contrast to the illustration, depending on methods of forming the first interfacial layer 127, the first interfacial layer 127 may include a portion extending along a sidewall of the first gate spacer 130.

The first high-k dielectric insulating layer 128 may include one or more of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. Further, while the oxides are mainly described with respect to the first high-k dielectric insulating layer 128, additionally or alternatively, the first high-k dielectric insulating layer 128 may include one or more nitrides of the metal materials described above (e.g., hafnium nitride) or the oxynitride of the metal materials described above (e.g., hafnium oxynitride)), but not limited thereto.

The first gate electrode 120 may include at least one of, for example, polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbon nitride (TaCN), tantalum silicon nitride (TaSiN), tantalum (Ta), cobalt (Co), ruthenium (Ru), aluminum (Al), copper (Cu), nickel (Ni), platinum (Pt), nickel-platinum (Ni—Pt), or tungsten (W).

Figure 11B:
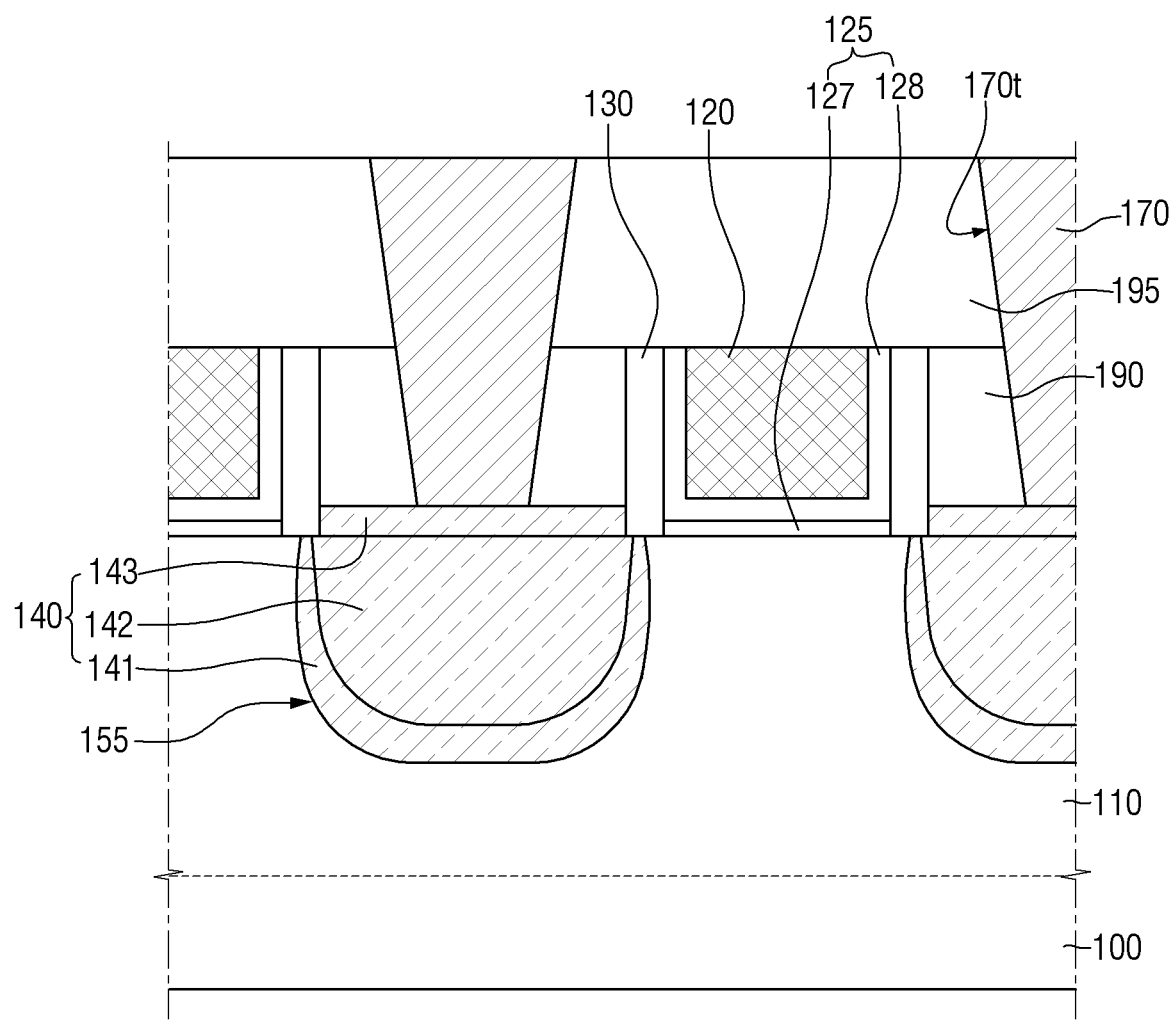

Referring to FIG. 11B, a second interlayer insulating layer 195 may be formed on the first interlayer insulating layer 190 and the first gate electrode 120.

The second interlayer insulating layer 195 may include at least one of silicon oxide, silicon nitride, silicon oxynitride, or low-k dielectric material, for example.

Next, a contact hole 170t may be formed within the second interlayer insulating layer 195 and the first interlayer insulating layer 190. The contact hole 170t may at least partially expose the first epitaxial pattern 140.

As illustrated in FIG. 11B, the sidewall of the contact hole 170t may be defined by the first interlayer insulating layer 190 and the second interlayer insulating layer 195, although example embodiments are not limited thereto.

As an alternative to the illustration in FIG. 11B, at least a portion of the sidewall of the contact hole 170t may be defined by the first gate spacer 130. In other words, the contact hole 170t may be a hole to form a self-aligned contact that is aligned by the first gate spacer 130, for example.

Next, a contact 170 may be formed within the first interlayer insulating layer 190 and the second interlayer insulating layer 195. The contact 170 may be formed by filling the contact hole 170t.

The contact 170 may be connected with the first epitaxial pattern 140. The contact 170 may include a conductive material.

FIG. 11B illustrates the contact 170 as a single layer pattern, but this is for convenience of explanation and the embodiments are not limited thereto. In other words, the contact 170 may be a pattern that includes multiple layers such as, for example, silicide layer pattern, barrier layer pattern, filling layer pattern, etc.

As illustrated in FIGS. 1A and 1B, the first fin-type pattern 110 may be a fin-type pattern that includes the same material, although example embodiments are not limited thereto. In the first fin-type pattern 110, a portion used as a channel region, and a portion surrounded by the field insulating layer 105 may include different materials from each other, or may include a same material in different compositions from each other.

Figure 12A:
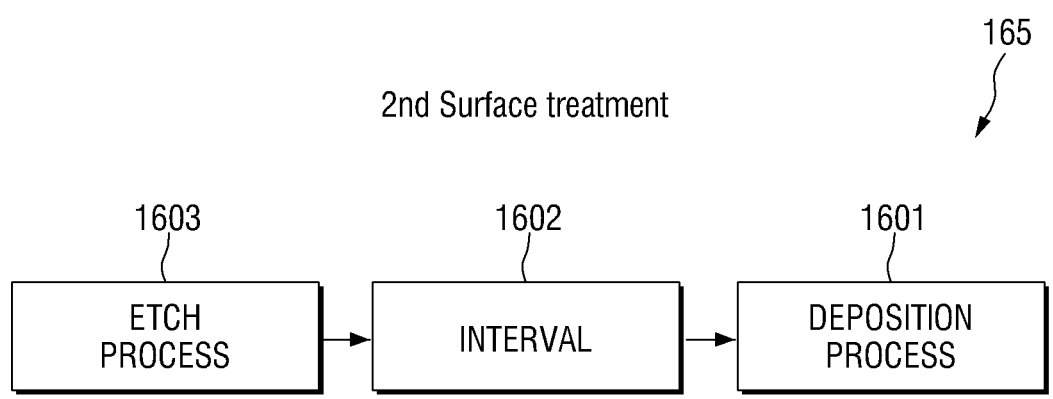
FIGS. 12A to 12C are views provided to explain methods of fabricating semiconductor devices according to some example embodiments.
Figure 12B:
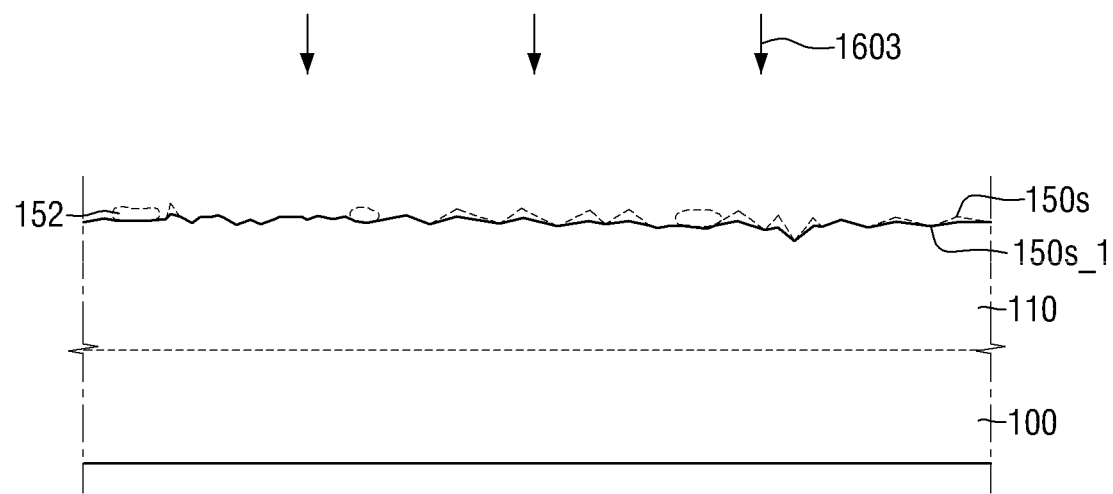
Figure 12C:
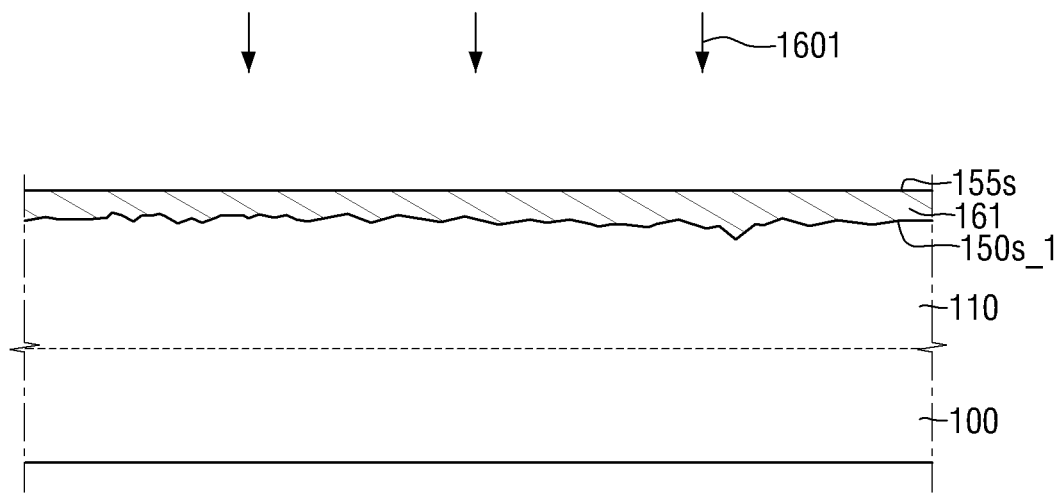

FIGS. 12A to 12C are views provided to explain methods of fabricating semiconductor devices according to some example embodiments. For convenience of explanation, differences with reference to FIGS. 1 to 11B will be mainly explained below.

FIG. 12B is an enlarged view illustrating a portion of the surface 150s (in dotted line) of the first recess.

Referring to FIG. 12B, the surface 150s of the first recess is illustrated to exemplify a deformed surface with broken or changed crystal planes, and example embodiments are not limited thereto. Further, there may be contaminants 152 (in dotted line) etc., deposited or produced on the surface 150s of the first recess.

Referring to FIG. 12A to FIG. 12C, methods of fabricating semiconductor devices according to some example embodiments may include a second surface treatment process 165, instead of the first surface treatment process 160. That is, the second recess 155 may be formed by treating the surface 150s of the first recess with the second surface treatment process 165.

The second surface treatment process 165 includes deposit process 1601 and etch process 1603. The second surface treatment process 165 may include a stabilizing interval 1602 between the etch process 1603 and the deposit process 1601. The second surface treatment process 165 may be performed in the deposition chamber 3002 (FIG. 8).

In contrast to the first surface treatment process 160, the deposit process 1601 may be performed after the etch process 1603 is performed in the second surface treatment process 165.

By the etch process 1603, the surface 150s of the first recess including surface defects may be etched. The etch process 1603 may form a cleaned surface 150s_1 of the first recess by etching the surface 150s of the first recess.

The etch process 1603 may remove or alleviate the high-index crystal plane exposed to the surface 150s of the first recess. Further, the etch process 1603 may remove the contaminants 152, etc. on the surface 150s of the first recess.

By the deposit process 1601 performed after the etch process 1603, a semiconductor liner film 161 may be formed along the cleaned surface 150s_1 of the first recess.

The second recess 155 may be formed, as the semiconductor liner film 161 is formed along the cleaned surface 150s_1 of the first recess. As noted above, the second recess 155 may refer to the first recess 150 after surface characteristics thereof have been improved by processes in accordance with embodiments of the present inventive concepts.

As the semiconductor liner film 161 is formed along the cleaned surface 150s_1 of the first recess including surface defects, the lattice structure of the surface 150s of the first recess, deformed or damaged by the dry etching, may be rearranged.

The semiconductor liner film 161 may aid the cleaned surface 150s_1 of the first recess having a lattice structure broken or deformed to recover into a crystal plane where a high-quality characteristic epitaxial layer can grow.

The deposit process 1601 and the etch process 1603 included in the second surface treatment process 165 are substantially similar or identical to the deposit process 1601 and the etch process 1603 included in the first surface treatment process 160, and will not be described in detail below for the sake of brevity.

Figure 13:
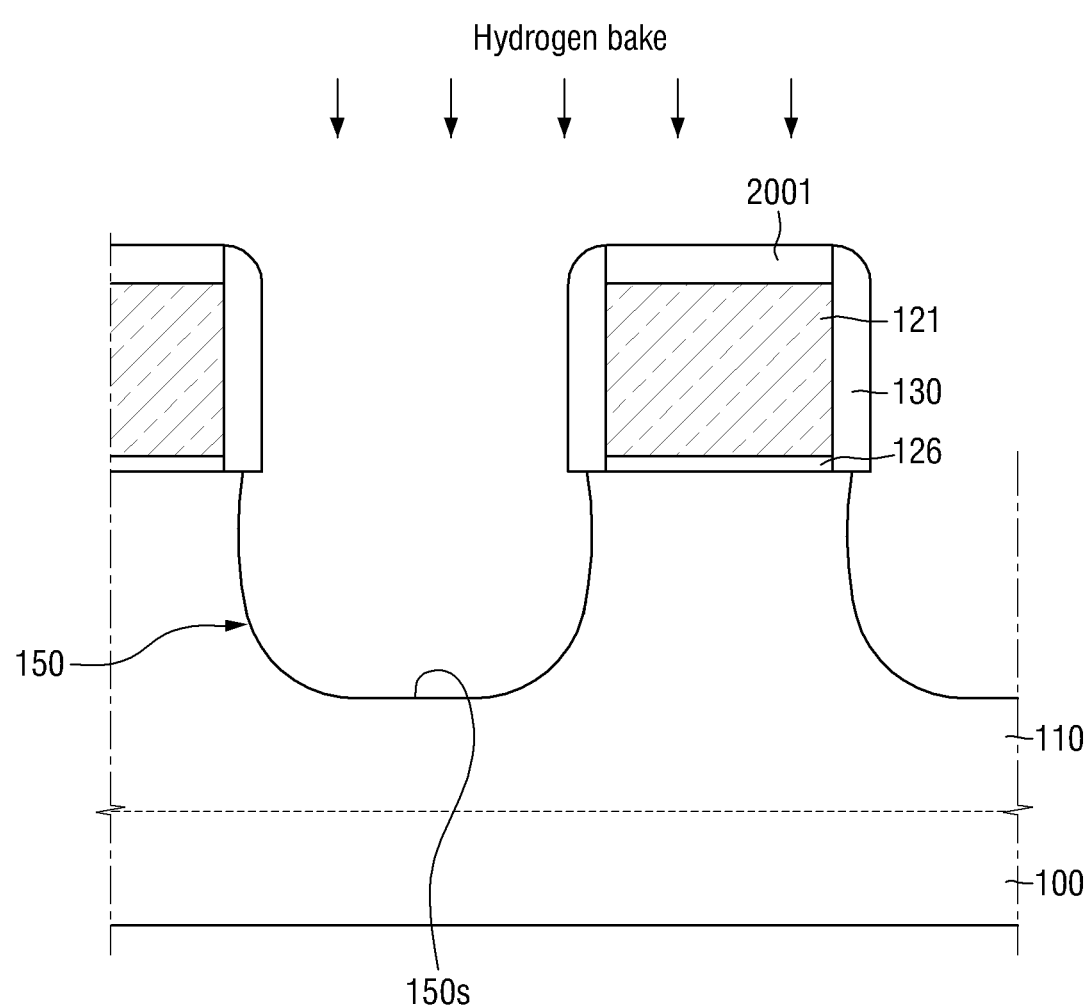
FIG. 13 is a view provided to explain methods of fabricating semiconductor devices according to some example embodiments.

FIG. 13 is a view provided to explain methods of fabricating semiconductor devices according to some example embodiments. For convenience of explanation, differences with reference to FIGS. 1 to 11B will be mainly explained below.

Referring to FIG. 13, methods of fabricating semiconductor devices according to some example embodiments may additionally include hydrogen bake process between the plasma etch process and the first surface treatment process 160.

The hydrogen bake process may remove the native oxide layer formed on the surface 150s of the first recess. More specifically, before the hydrogen bake process, the plasma etch process may be performed to remove the native oxide layer formed on the surface 150s of the first recess.

However, the plasma etch process may not entirely remove the native oxide layer formed on the surface 150s of the first recess.

Accordingly, after the plasma etch process, the hydrogen bake process may be performed to remove remaining portions of the native oxide layer which may reside on the surface 150s of the first recess.

The process gas for the hydrogen bake process may include hydrogen. The process gas for the hydrogen bake process may include 100% hydrogen, but may additionally include inert gas other than hydrogen.

The hydrogen bake process may be performed in the deposition chamber 3002 (FIG. 8) where the first surface treatment process 160 is performed. That is, the hydrogen bake process and the first surface treatment process may be performed in-situ.

However, the plasma etch process and the hydrogen bake process to remove the native oxide layer formed on the surface 150s of the first recess may be performed in different chambers from each other. That is, the plasma etch process performed in the cleaning chamber 3001 (FIG. 8), and the hydrogen bake process performed in the deposition chamber 3002 (FIG. 8) may be performed ex-situ.

The temperature for performing the hydrogen bake process may be in such a temperature range that allows hydrogen to react with the native oxide layer formed on the surface 150s of the first recess, and that keeps a gate structure including the first dummy gate electrode 121 from collapsing. For example, the temperature for performing the hydrogen bake process may be higher than the temperature for performing the first surface treatment process 160.

Figure 14A:
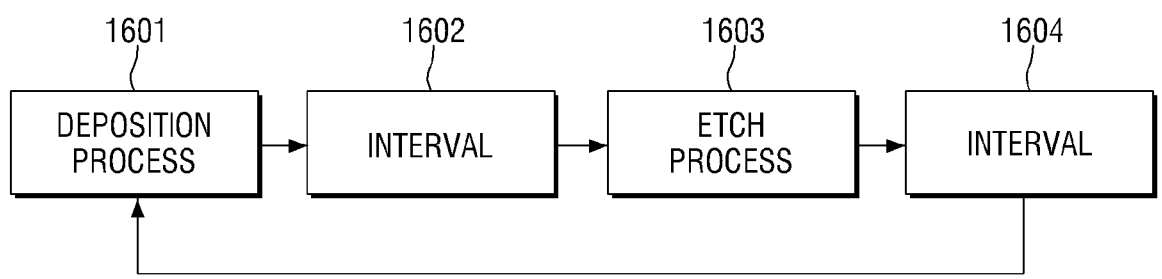
FIGS. 14A and 14B are views provided to explain methods of fabricating semiconductor devices according to some example embodiments.
Figure 14B:
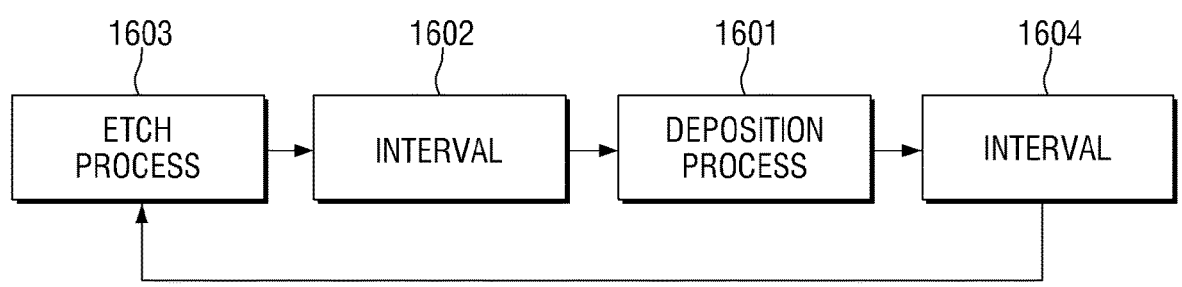

FIG. 14A and FIG. 14B are views provided to explain methods of fabricating semiconductor devices according to some example embodiments.

Referring to FIG. 14A, methods of fabricating semiconductor devices according to some example embodiments may involve performing the first surface treatment process 160 for a plurality of times.

The stabilizing interval 1602 may be inserted between the step of performing the deposit process 1601 and the step of performing the etch process 1603, and the stabilizing interval 1604 may be inserted between the step of performing the etch process 1603 and the step of performing the deposit process 1601.

The first surface treatment process may include a first sub-surface treatment process, and a second sub-surface treatment process performed after the first sub-surface treatment process.

The first sub-surface treatment process may include a first sub-deposit process 1601 and a first sub-etch process 1603 performed after the first sub-deposit process 1601. The second sub-surface treatment process may include a second sub-deposit process 1601 and a second sub-etch process 1603 performed after the second sub-deposit process 1601.

In this case, the first sub-deposit process 1601 included in the first sub-surface treatment process, and the second sub-deposit process 1601 included in the second sub-surface treatment process may have substantially the same process conditions.

Further, the first sub-etch process 1603 included in the first sub-surface treatment process, and the second sub-etch process 1603 included in the second sub-surface treatment process may have substantially the same process conditions.

That is, even when the first surface treatment process 160 is performed repeatedly for a plurality of times, the process conditions of the respective sub-deposit processes 1601 included in the respective sub-surface treatment processes may be similar or identical, and the process conditions of the respective sub-etch processes 1603 included in the respective sub-surface treatment processes may be similar or identical.

Referring to FIG. 14B, methods of fabricating semiconductor devices according to some example embodiments may involve performing the second surface treatment process 165 for a plurality of times.

The second surface treatment process performed for a plurality of times may be substantially the same as the first surface treatment process performed for a plurality of times as described above.

FIGS. 15 to 19 are views provided to explain methods of fabricating semiconductor devices according to some example embodiments. For convenience of explanation, overlapping description with the example embodiments described above with reference to FIGS. 1 to 14B will be omitted.

Figure 15:
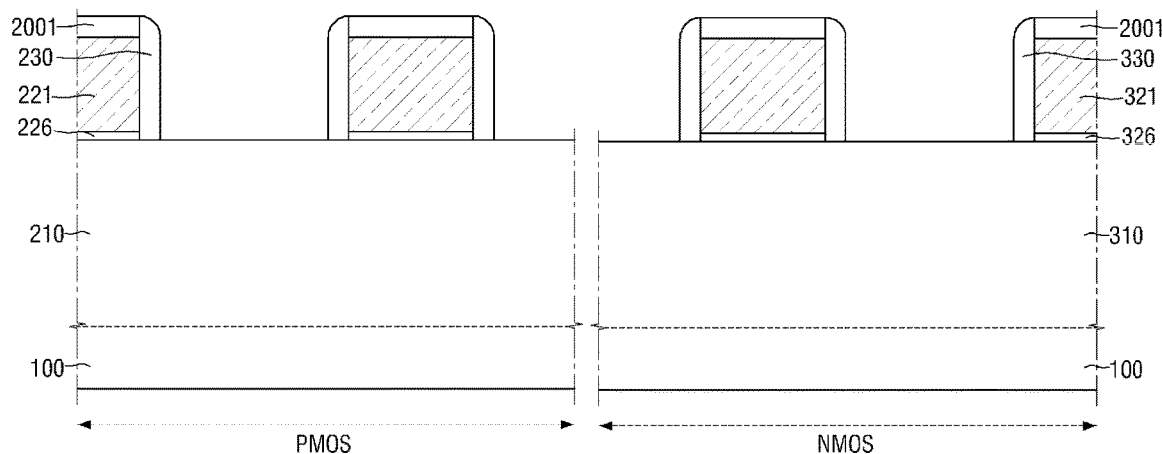
FIGS. 15 to 19 are views provided to explain methods of fabricating semiconductor devices according to some example embodiments.

Referring to FIG. 15, a second fin-type pattern 210 may be formed in a PMOS region of the substrate 100, and a third fin-type pattern 310 may be formed in an NMOS region of the substrate 100.

The PMOS region of the substrate 100, and the NMOS region of the substrate 100 may be regions spaced from each other, or connected with each other.

The second fin-type pattern 210 and the third fin-type pattern 310 may be fin-type patterns that include same material, or alternatively, may be fin-type patterns including different materials from each other.

That is, the second fin-type pattern 210 formed in the PMOS region may include a material that can reinforce or improve the hole mobility, and the third fin-type pattern 310 formed in the NMOS region may include a material that can reinforce or improve the electron mobility. Alternatively, the second fin-type pattern 210 formed in the PMOS region may include a heterogeneous material stack structure that can reinforce or improve the hole mobility, and the third fin-type pattern 310 formed in the NMOS region may include a heterogeneous material stack structure that can reinforce or improve the electron mobility.

The description about the second fin-type pattern 210 and the third fin-type pattern 310 may be substantially similar to that about the first fin-type pattern 110, and will not be redundantly described below.

Next, a second dummy gate electrode 221 intersecting the second fin-type pattern 210 is formed on the second fin-type pattern 210, and a third dummy gate electrode 321 intersecting the third fin-type pattern 310 is formed on the third fin-type pattern 310.

The second dummy gate insulating layer 226, the second dummy gate electrode 221, and the gate hard mask 2001 may be formed on the second fin-type pattern 210, being sequentially stacked on one another. Further, the third dummy gate insulating layer 326, the third dummy gate electrode 321, and the gate hard mask 2001 may be formed on the third fin-type pattern 310, being sequentially stacked on one another.

A second gate spacer 230 may be formed on a sidewall of the second dummy gate electrode 221, and a third gate spacer 330 may be formed on a sidewall of the third dummy gate electrode 321.

Figure 16:
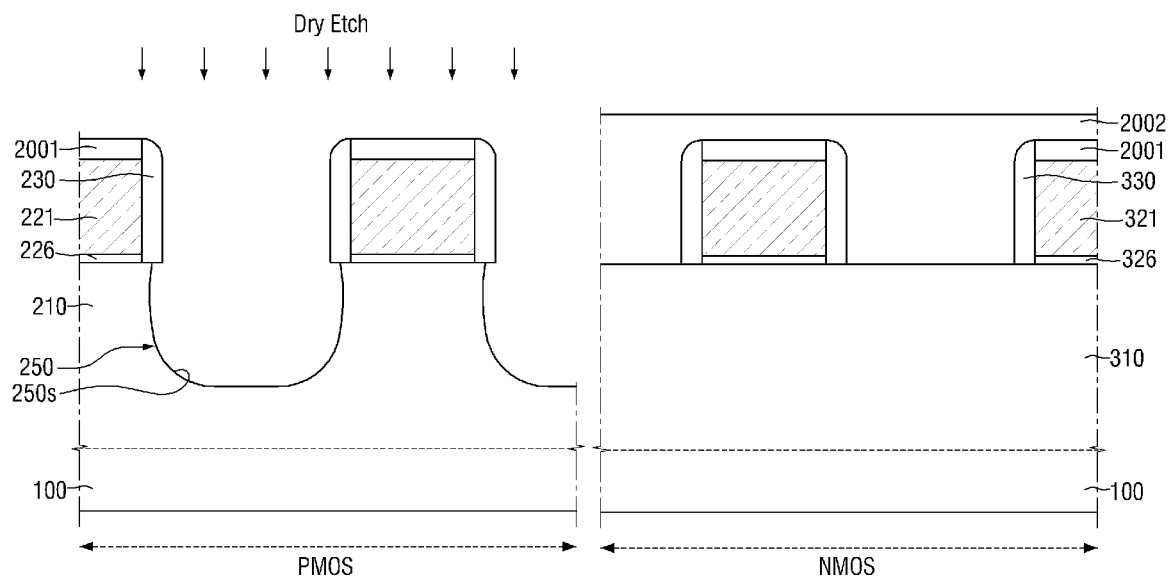

Referring to FIG. 16, a first mask pattern 2002 may be formed on the NMOS region of the substrate 100.

The PMOS region of the substrate 100 may be exposed by the first mask pattern 2002.

Next, a third recess 250 may be formed within the second fin-type pattern 210 by using dry etching. The third recess 250 may be formed adjacent to the second dummy gate electrodes 221.

The third recess 250 may be formed by dry etching the second fin-type pattern 210 exposed between the second dummy gate electrodes 221. The dry etching may include, for example, anisotropic dry etching and isotropic dry etching, but not limited thereto.

Next, the native oxide layer formed on the surface 250s of the third recess may be removed.

Figure 17:
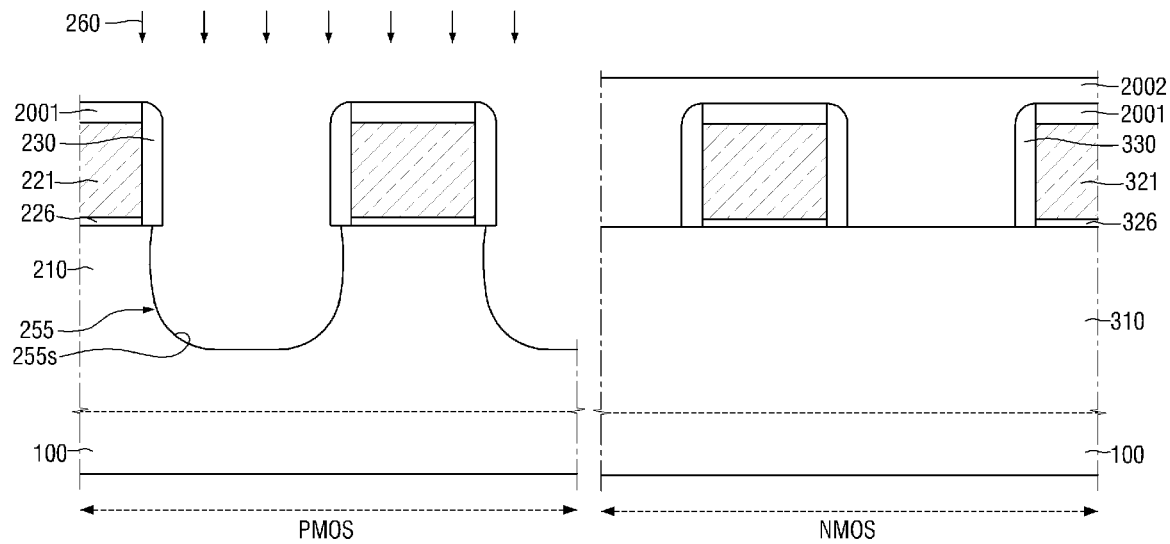

Referring to FIG. 17, the surface 250s of the third recess may be surface-treated by using the third surface-treatment process 260.

Surface-treating the surface 250s of the third recess may form a treated recess 255 including improved surface characteristics (also referred to herein as a fourth recess 255) adjacent to the second dummy gate electrodes 221.

By the third surface treatment process 260 including the deposit process and the etch process, the surface defects of the surface 250s of the third recess may be reduced or cured. The fourth recess 255 may be formed by curing the surface defects of the surface 250s of the third recess.

The third surface treatment process 260 may be performed in a same manner as the first surface treatment process or the second surface treatment process. Alternatively, the third surface treatment process 260 may involve the first surface treatment process or the second surface treatment process being performed a plurality of times.

By the third surface treatment process 260, a semiconductor liner film including p-type dopant is not formed along the surface 250s of the third recess.

Figure 18:
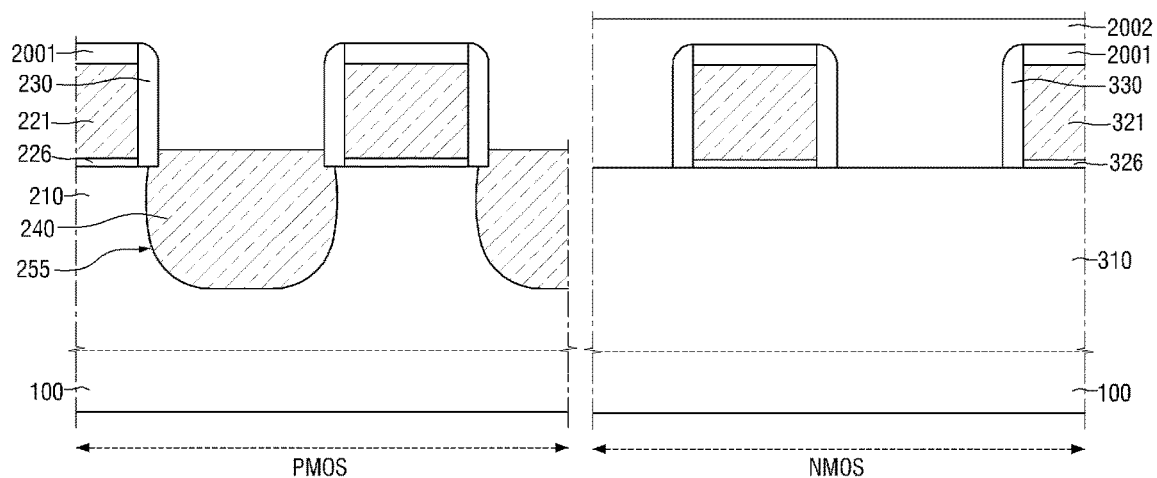

Referring to FIG. 18, a second epitaxial pattern 240 filling the fourth recess 255 may be formed within the second fin-type pattern 210.

Next, the first mask pattern 2002 formed in the NMOS region of the substrate 100 may be removed.

Figure 19:
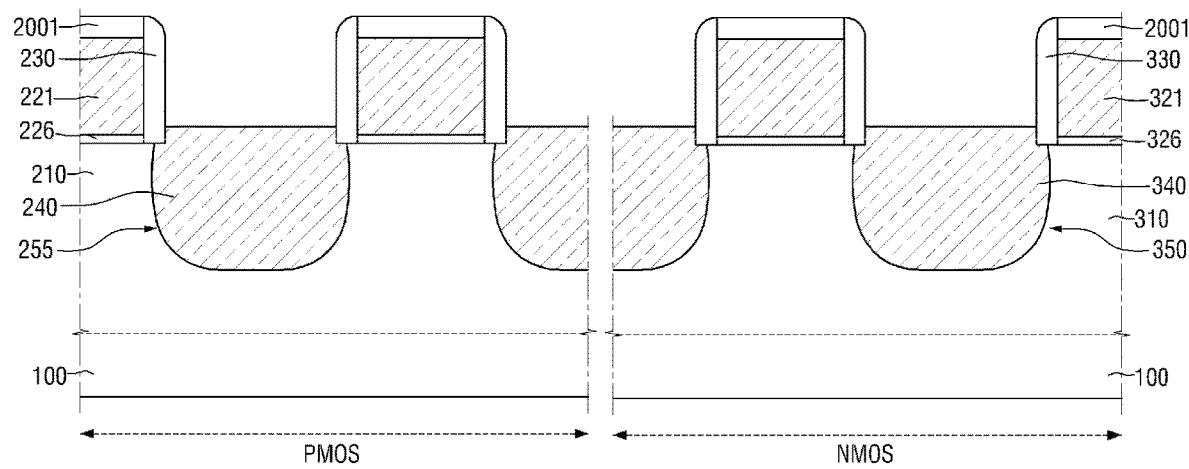

Referring to FIG. 19, a fifth recess 350 may be formed within the third fin-type pattern 310. The fifth recess 350 may be formed adjacent to the third dummy gate electrodes 321.

Next, the native oxide layer that may be formed on the surface of the fifth recess 350 may be removed.

Next, a third epitaxial pattern 340 filling the fifth recess 350 may be formed within the third fin-type pattern 310.

The surface treatment process for surface-treating the surface of the fifth recess 350 may not be performed between the step of forming the fifth recess 350 and the step of forming the third epitaxial pattern 340.

That is, while the third surface treatment process 260 may be performed before the second epitaxial pattern 240 is formed in the PMOS region of the substrate 100, the surface treatment process may not be performed before the third epitaxial pattern 340 is formed in the NMOS region of the substrate 100.

Figure 20:
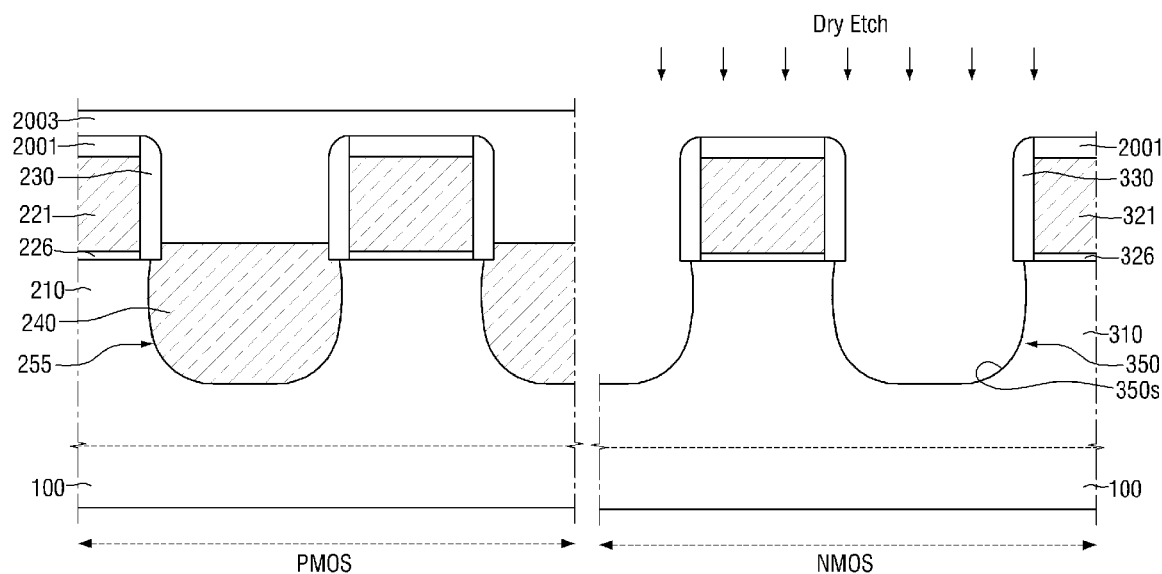
FIGS. 20 to 22 are views provided to explain methods of fabricating semiconductor devices according to some example embodiments.
Figure 21:
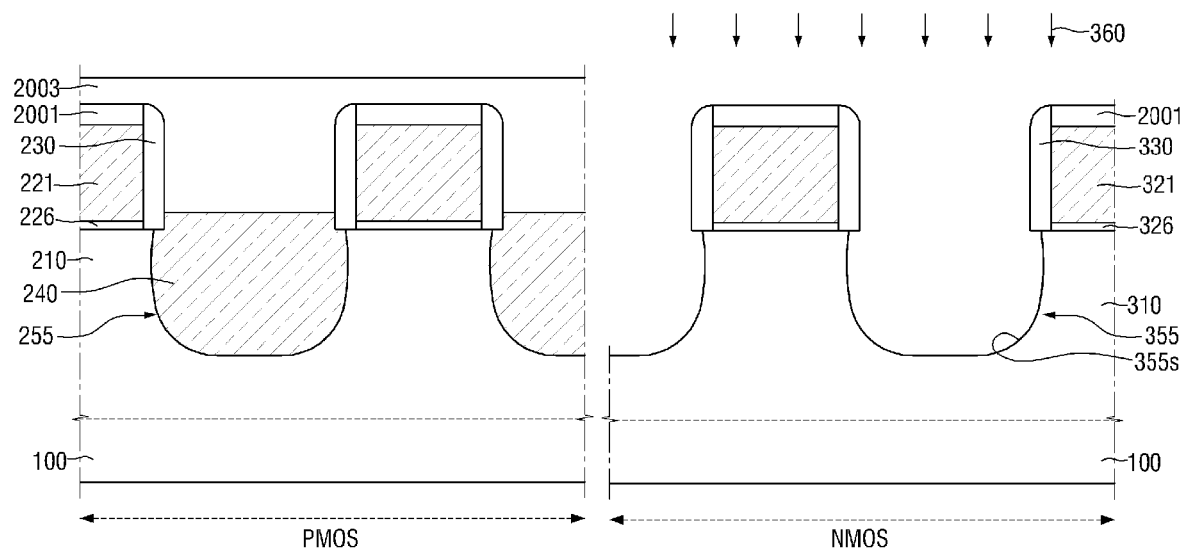
Figure 22:
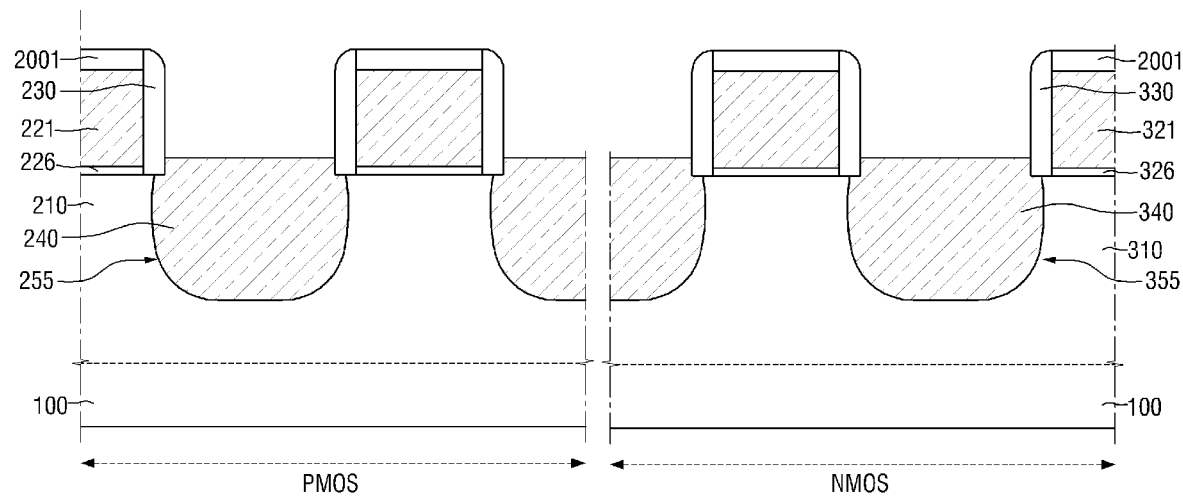

FIGS. 20 to 22 are views provided to explain methods of fabricating semiconductor devices according to some example embodiments. For convenience of explanation, differences with reference to FIGS. 15 to 19 will be mainly explained below.

For reference, FIG. 20 may illustrate operations performed after the step described with reference to FIG. 18.

Referring to FIG. 20, a second mask pattern 2003 may be formed on the PMOS region of the substrate 100.

The NMOS region of the substrate 100 may be exposed by the second mask pattern 2003.

Next, the fifth recess 350 may be formed within the third fin-type pattern 310 by using dry etching. The fifth recess 350 may be formed adjacent to the third dummy gate electrodes 321.

The fifth recess 350 may be formed by dry etching the second fin-type pattern 310 exposed between the third dummy gate electrodes 321.

Next, the native oxide layer formed on the surface 350s of the fifth recess may be removed.

Referring to FIG. 21, the surface 350s of the fifth recess may be surface-treated by using the fourth surface-treatment process 360.

By surface-treating the surface 550s of the fifth recess, a treated recess 355 including improved surface characteristics (also referred to herein as a sixth recess 355) may be formed adjacent to the third dummy gate electrodes 321.

By the fourth surface treatment process 260 including the deposit process and the etch process, the surface defects of the surface 350s of the fifth recess may be reduced or cured. The sixth recess 355 may be formed by curing the surface defects of the surface 350s of the fifth recess.

The fourth surface treatment process 360 may be performed in a same manner as the first surface treatment process or the second surface treatment process. In some embodiments, the fourth surface treatment process 360 may involve the first surface treatment process or the second surface treatment process being performed a plurality of times.

By the fourth surface treatment process 360, a semiconductor liner film including n-type dopant is not formed along the surface 350s of the fifth recess.

Moreover, the third surface treatment process 260 performed in the PMOS region, and the fourth surface treatment process 360 performed in the NMOS region may have a same process condition as each other, or alternatively, may have different process conditions from each other.

When the third surface treatment process 260 and the fourth surface treatment process 360 have different process conditions from each other, the third surface treatment process 260 and the fourth surface treatment process 360 may have different temperatures, pressures, flow rates of hydrogen, etc., but the relationship regarding temperature, pressure, flow rate of hydrogen, etc. between deposit conditions and etch conditions may be the same.

For example, this is because the state of the surface 255s of the fourth recess for the second epitaxial pattern 240 formed in the PMOS region, and the state of the surface 355s of the sixth recess for the third epitaxial pattern 340 formed in the NMOS region may be different from each other. Or, this is because the second epitaxial pattern 240 formed in the PMOS region, and the third epitaxial pattern 340 formed in the NMOS region may have growth conditions different from each other.

Referring to FIG. 22, the third epitaxial pattern 340 filling the sixth recess 355 may be formed within the third fin-type pattern 310.

Next, the second mask pattern 2003 formed in the PMOS region of the substrate 100 may be removed.

As described with reference to FIGS. 15 to 22, the fabricating method may involve initially forming the second epitaxial pattern 240 in the PMOS region, and then forming the third epitaxial pattern 340 in the NMOS region, although example embodiments are not limited thereto.

That is, the third epitaxial pattern 340 may be initially formed in the NMOS region, and then the second epitaxial pattern 240 is formed in the PMOS region.

Figure 23:
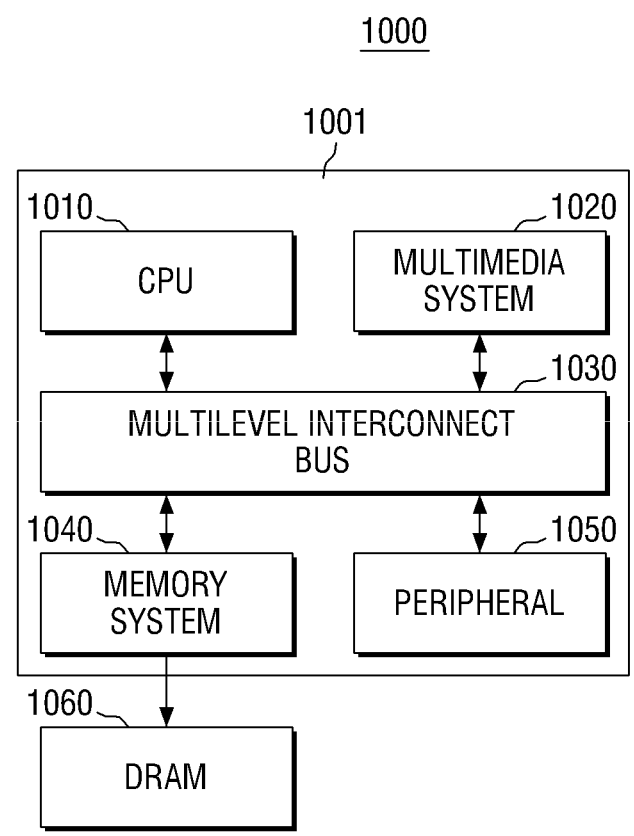
FIG. 23 is a block diagram of an SoC system comprising semiconductor devices fabricated by methods of fabricating semiconductor devices according to some example embodiments.

FIG. 23 is a block diagram of a system-on-chip (SoC) system comprising semiconductor devices fabricated by methods of fabricating semiconductor devices according to some example embodiments.

Referring to FIG. 23, an SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation for driving of the SoC system 1000. In some example embodiments, the CPU 1010 may be configured as a multi-core environment which includes a plurality of cores.

The multimedia system 1020 may be used for performing a variety of multimedia functions on the SoC system 1000. The multimedia system 1020 may include a three-dimensional (3D) engine module, a video codec, a display system, a camera system, a post-processor, etc.

The bus 1030 may be used for exchanging data/communication among the CPU 1010, the multimedia system 1020, the memory system 1040 and the peripheral circuit 1050. In some example embodiments, the bus 1030 may have a multi-layer structure. Specifically, an example of the bus 1030 may be a multi-layer advanced high-performance bus (AHB), or a multi-layer advanced eXtensible interface (AXI), although example embodiments are not limited herein.

The memory system 1040 may provide environments for the application processor 1001 to connect to an external memory (e.g., DRAM 1060) and perform high-speed operation. In some example embodiments, the memory system 1040 may include a separate controller (e.g., DRAM controller) to control an external memory (e.g., DRAM 1060).

The peripheral circuit 1050 may provide environments for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory for the operation of the application processor 1001. In some example embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the example embodiments explained above.

In concluding the detailed description, those skilled in the art will appreciate that many variations and modifications can be made to the embodiments without substantially departing from the principles of the present inventive concepts. Therefore, the disclosed embodiments of the invention are used in a generic and descriptive sense and not for purposes of limitation.

What is claimed is:

1. A method of fabricating a semiconductor device including nanosheet, the method comprising:
    forming a fin-type pattern protruding on a substrate, the fin-type pattern including silicon(Si) and silicon-germanium(SiGe);
    forming a gate electrode intersecting the fin-type pattern;
    forming a first recess adjacent the gate electrode, within the fin-type pattern, and by dry etching;
    forming a second recess by treating a surface of the first recess with a surface treatment process including a deposit process and an etch process, wherein the deposit process includes forming a semiconductor liner film along the surface of the first recess, and the semiconductor liner film is an undoped semiconductor film, and wherein the etch process includes etching at least a portion of the undoped semiconductor film; and
    forming an epitaxial pattern in the second recess,
    wherein a temperature for performing the deposit process is less than or equal to a temperature for performing the etch process,
    wherein the etch process includes etching the at least a portion of the undoped semiconductor film,
    wherein the surface treatment process is performed for a plurality of times,
    wherein the surface treatment process includes a first surface treatment process and a second surface treatment process,
    the first surface treatment process includes a first deposit process and a first etch process,
    the second surface treatment process includes a second deposit process and a second etch process,
    the first deposit process and the second deposit process have substantially identical process conditions,
    the first etch process and the second etch process have substantially identical process conditions, and
    wherein a flow of an etching gas is discontinuous in a stabilizing interval between the first deposit process and the first etch process and between the second deposit process and the second etch process,
    wherein the surface of the first recess comprises high-index crystal planes and low-index crystal planes, and
    wherein the etch process includes etching the high-index crystal planes faster than the low-index crystal planes.

2. The method of claim 1, wherein a first process gas of the deposit process and a second process gas of the etch process each includes the etching gas.

3. The method of claim 1, wherein the etching gas is a chlorine-based gas.

4. The method of claim 1, wherein a flow rate of hydrogen in the deposit process is greater than or equal to a flow rate of hydrogen in the etch process.

5. The method of claim 1, wherein the surface treatment process exposes a portion of the substrate, and the portion of the substrate defines a portion of the second recess.

6. The method of claim 1, wherein the etch process includes etching an entirety of the undoped semiconductor film.

7. A method of fabricating a semiconductor device including nanosheet, the method comprising:
    forming a recess in a semiconductor substrate adjacent a gate electrode thereon, the recess comprising defects in or on a surface thereof;
    performing a surface treatment process comprising a deposit process and an etch process, thereby forming a semiconductor liner film on the surface of the recess, wherein the semiconductor liner film is undoped; and
    epitaxially growing a doped semiconductor layer in the recess responsive to performing the surface treatment process, thereby defining a source/drain region in the semiconductor substrate adjacent the gate electrode,
    wherein a flow rate of hydrogen in the deposit process is greater than or equal to that of the etch process, and/or wherein a temperature and/or pressure of the deposit process is less than or equal to that of the etch process,
    wherein the deposit process is free of a dopant gas, wherein the deposit process and the etch process respectively include a same etching gas, and wherein flow of the same etching gas is discontinuous between the deposit process and the etch process,
    wherein the semiconductor substrate comprises a semiconductor fin protruding therefrom, and wherein the semiconductor fin includes silicon(Si) and silicon-germanium(SiGe), and wherein forming the recess comprises performing anisotropic and isotropic dry etch processes in a sequential order such that the recess extends into a sidewall of the semiconductor fin,
    wherein the etch process includes etching at least a portion of the semiconductor liner film that is undoped,
    wherein the surface of the recess comprises high-index crystal planes and low-index crystal planes, and
    wherein the etch process includes etching the high-index crystal planes faster than the low-index crystal planes.

8. The method of claim 7, further comprising:
    before performing the surface treatment process, removing a native oxide layer on the surface of the recess.

9. The method of claim 8, wherein the removing the native oxide layer comprises a hydrogen baking process and/or a plasma etching process.

10. The method of claim 9, wherein the hydrogen baking process and the surface treatment process are performed in-situ in a same process chamber.

* * * * *